(12) United States Patent
Igeta

(10) Patent No.: US 10,002,557 B2
(45) Date of Patent: Jun. 19, 2018

(54) DISPLAY DEVICE

(71) Applicant: Japan Display Inc., Minato-ku (JP)

(72) Inventor: Koichi Igeta, Tokyo (JP)

(73) Assignee: Japan Display Inc., Minato-ku (JP)

( * ) Notice: Subject to any disclaimer, the term of this patent is extended or adjusted under 35 U.S.C. 154(b) by 0 days. days.

(21) Appl. No.: 15/599,946

(22) Filed: May 19, 2017

(65) Prior Publication Data

US 2017/0337864 A1 Nov. 23, 2017

(30) Foreign Application Priority Data

May 19, 2016 (JP) .................................. 2016-100474

(51) Int. Cl.
| | |
|---|---|
| *G09G 3/20* | (2006.01) |
| *G09G 3/36* | (2006.01) |
| *G09G 3/18* | (2006.01) |
| *G02F 1/133* | (2006.01) |
| *H01L 25/04* | (2014.01) |

(52) U.S. Cl.
CPC ........... *G09G 3/2074* (2013.01); *G02F 1/133* (2013.01); *G09G 3/18* (2013.01); *G09G 3/3607* (2013.01); *G09G 3/3685* (2013.01); *H01L 25/04* (2013.01)

(58) Field of Classification Search
CPC ...... G09G 3/2074; G09G 3/18; G09G 3/3607; G09G 3/3685; G02F 1/133; H01L 25/04
See application file for complete search history.

(56) References Cited

U.S. PATENT DOCUMENTS

| | | | |
|---|---|---|---|
| 7,733,318 B2* | 6/2010 | Awakura | G02F 1/13318 345/204 |
| 8,873,126 B2 | 10/2014 | Tomikawa et al. | |
| 8,941,570 B2 | 1/2015 | Nishida et al. | |
| 2003/0107543 A1* | 6/2003 | Nakano | G09G 3/3607 345/90 |

FOREIGN PATENT DOCUMENTS

| | | |
|---|---|---|
| JP | 5-323336 | 12/1993 |
| JP | 8-201830 | 8/1996 |
| JP | 2007-86147 | 4/2007 |
| JP | 2013-25066 | 2/2013 |
| JP | 2013-29716 | 2/2013 |
| JP | 2013-68695 | 4/2013 |
| JP | 2013-73183 | 4/2013 |
| JP | 2016-9046 | 1/2016 |

* cited by examiner

*Primary Examiner* — Michael Teitelbaum
(74) *Attorney, Agent, or Firm* — Oblon, McClelland, Maier & Neustadt, L.L.P.

(57) ABSTRACT

In one embodiment, a display device includes first and second substrates, a liquid crystal layer, a display area, a surrounding area, a light-shielding layer overlapping the surrounding area, a voltage supply line in the surrounding area and extending in a first direction, and first and second electrodes provided in the surrounding area and connected to the voltage supply line. The first and second electrodes are alternately arranged in either the first direction or a second direction crossing the first direction. Further, a first voltage supplied to the first electrode is different from a second voltage supplied to the second electrode.

18 Claims, 19 Drawing Sheets

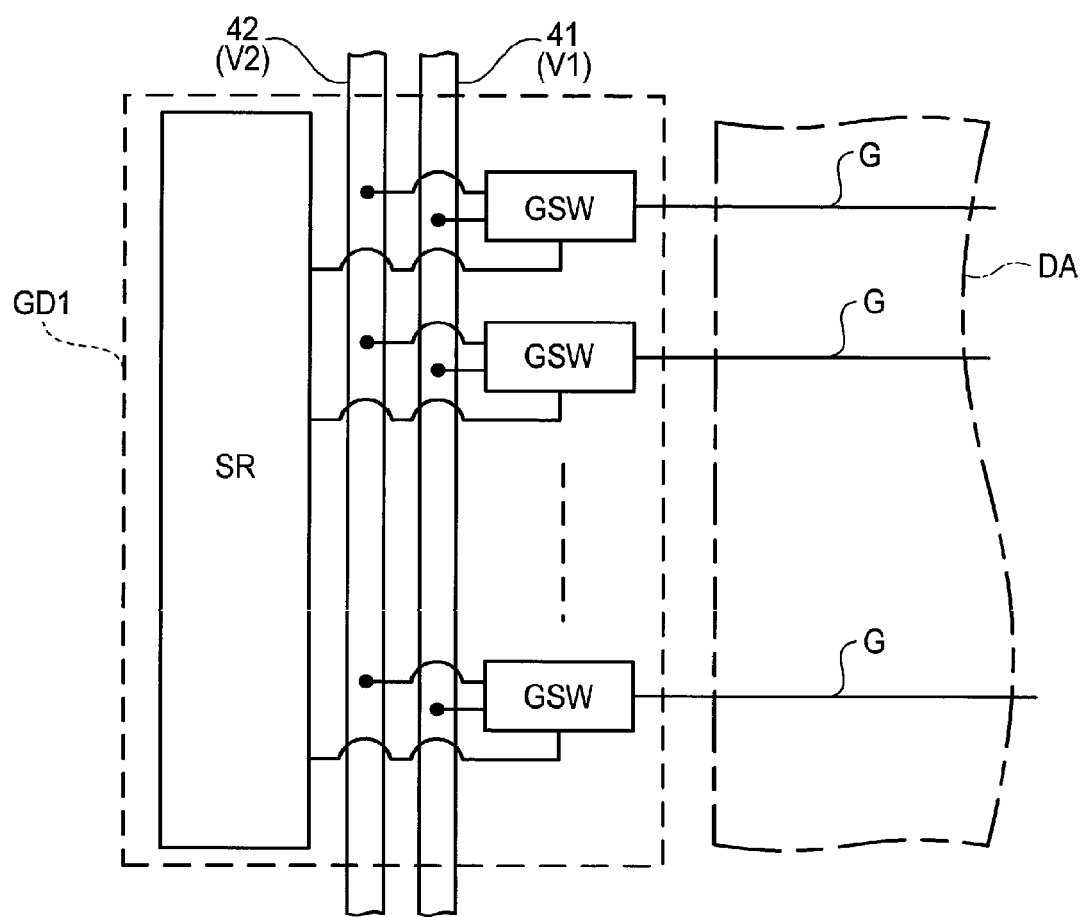
F I G. 2

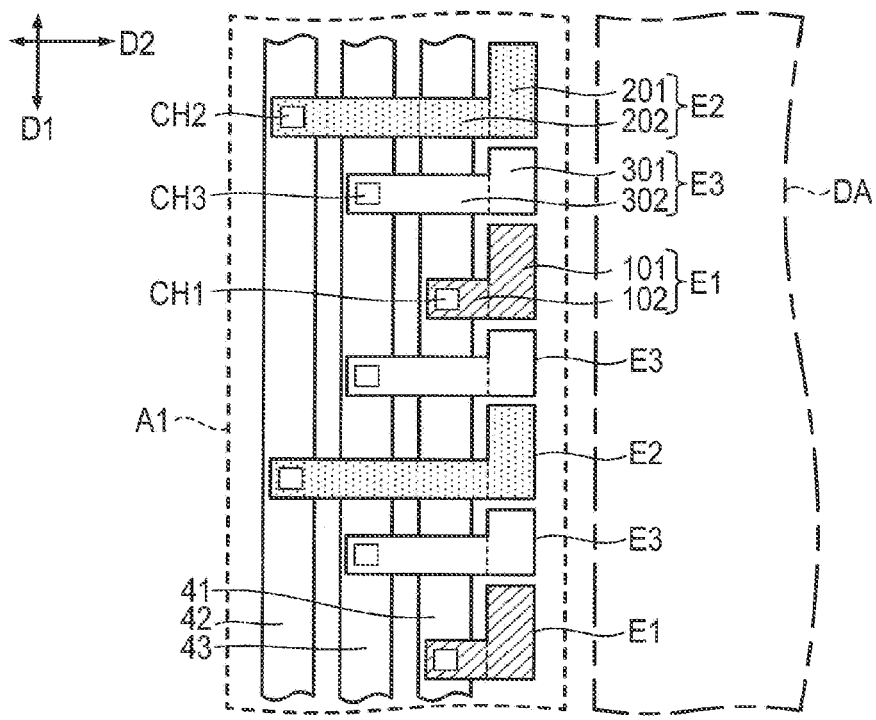
F I G. 10
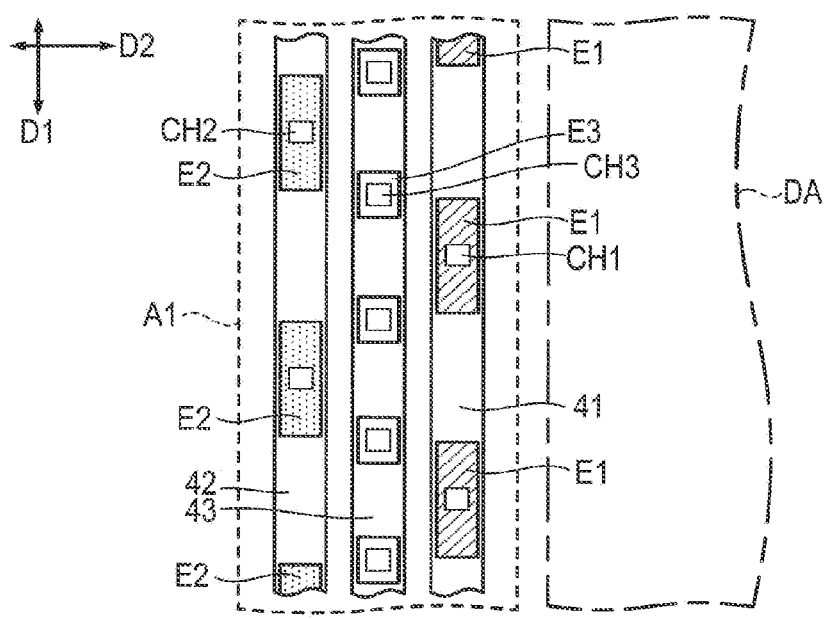
F I G. 11

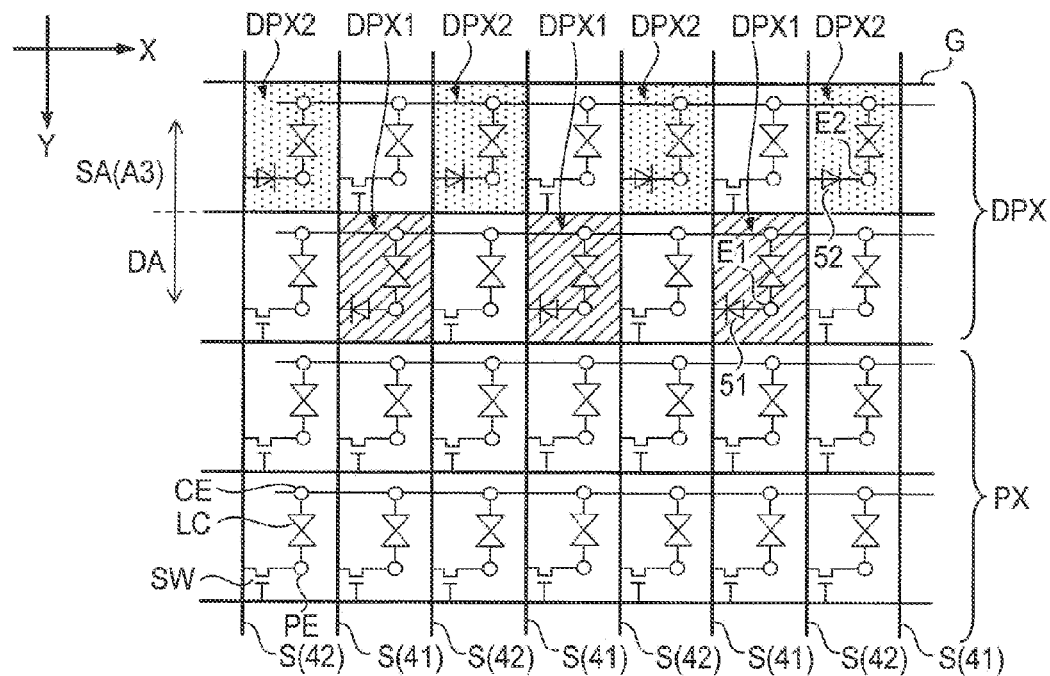
F I G. 17
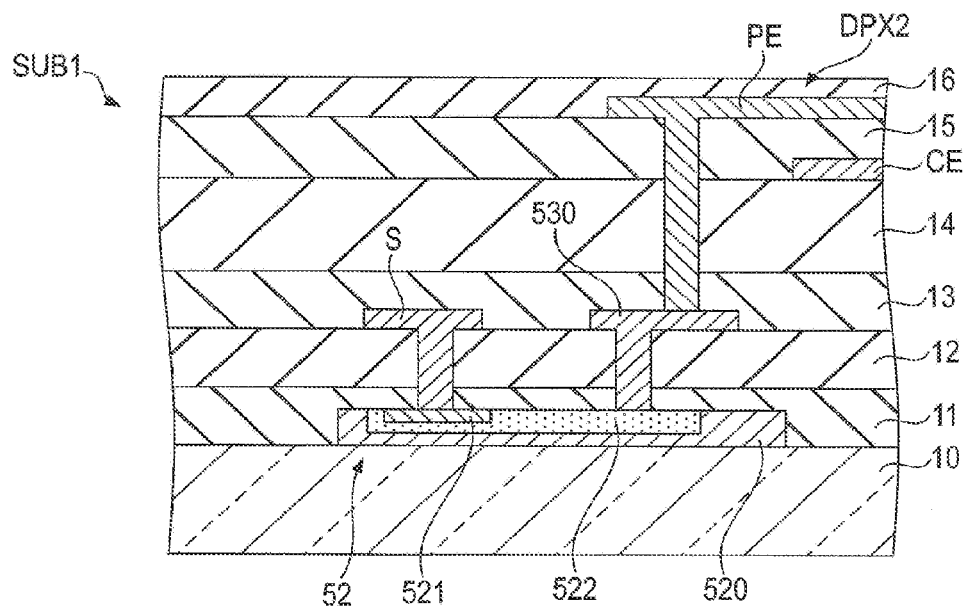
F I G. 18

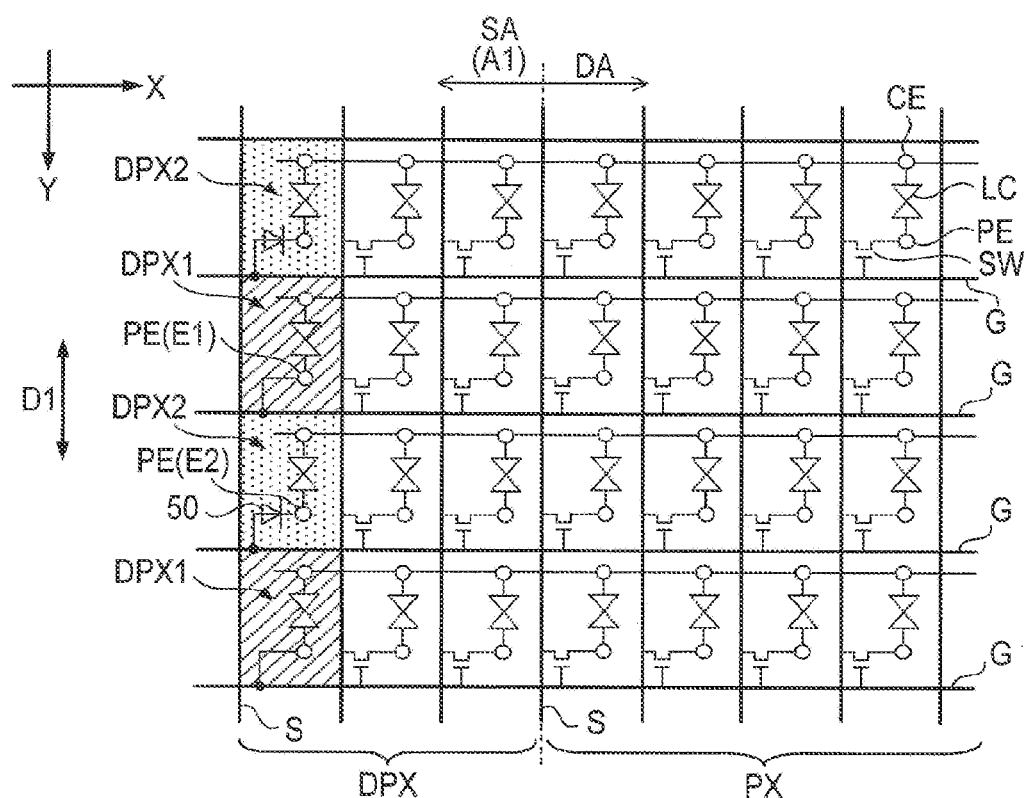
F I G. 21

DISPLAY DEVICE

CROSS-REFERENCE TO RELATED APPLICATIONS

This application is based upon and claims the benefit of priority from Japanese Patent Application No. 2016-100474, filed May 19, 2016, the entire contents of which are incorporated herein by reference.

FIELD

Embodiments described herein relate generally to a display device.

BACKGROUND

As a display device, a liquid crystal display including an array substrate where a switching element and a pixel electrode are formed, a counter-substrate opposed to the array substrate, and a liquid crystal layer interposed between the array substrate and the counter-substrate has been widely used.

It is known that ions resulting from impurities or ions dissolved from a sealant which attaches the array substrate to the counter-substrate are mixed in the liquid crystal layer. If the ion concentration locally increases in the liquid crystal layer, the effective voltage to be applied to the liquid crystal layer will decrease in this portion. As the effective voltage decreases, the luminance in this portion decreases, accordingly, and the decrease in the luminance will lead to a negative effect such as a dark spot on the display image.

BRIEF DESCRIPTION OF THE DRAWINGS

FIG. 2 is a schematic diagram showing a structural example of a first scan driver.

FIG. 10 is a diagram showing a forth example.

FIG. 11 is a diagram showing a fifth example.

FIG. 17 is a diagram showing a ninth example.

FIG. 18 is a sectional diagram showing a structural example of a diode functioning as a second rectifier.

FIG. 21 is a diagram showing a tenth example.

DETAILED DESCRIPTION

Figure 1:
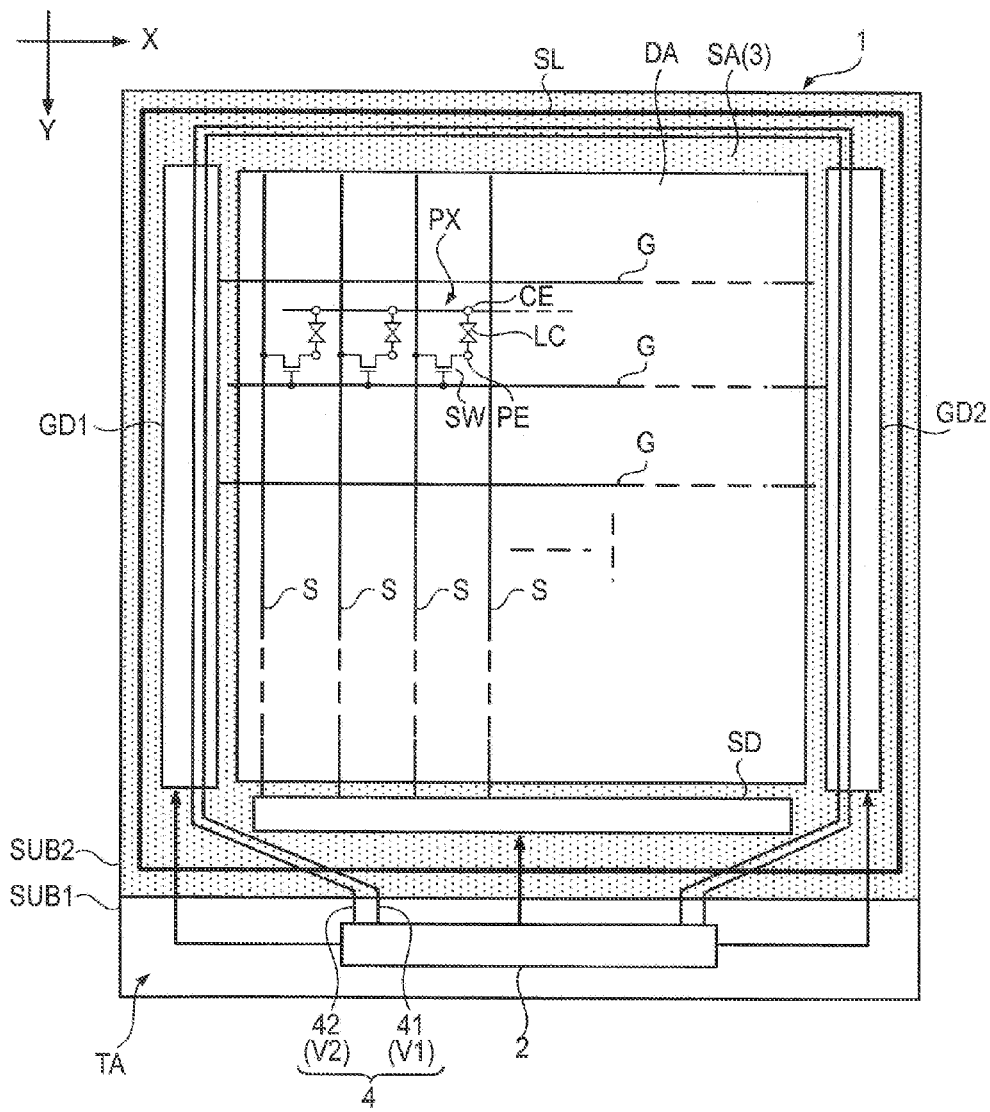
FIG. 1 is a schematic plan view of a display device of a first embodiment.

In general, according to one embodiment, a display device includes: a first substrate; a second substrate opposed to the first substrate; and a liquid crystal layer between the first substrate and the second substrate. The display device further includes: a display area; a surrounding area outside the display area; a light-shielding layer overlapping the surrounding area; a voltage supply line provided in the surrounding area and extending in a first direction; and a first electrode and a second electrode provided in the surrounding area and connected to the voltage supply line. The first electrode and the second electrode are alternately arranged in either the first direction or a second direction crossing the first direction. Further, a first voltage supplied to the first electrode is different from a second voltage supplied to the second electrode.

According to another embodiment, a display device includes: a first substrate; a second substrate opposed to the first substrate; and a liquid crystal layer between the first substrate and the second substrate. The display device further includes: a display area; a surrounding area outside the display area; a light-shielding layer overlapping the surrounding area; a voltage supply line provided in the surrounding area and extending in a first direction; a first electrode and a second electrode provided in the surrounding area and connected to the voltage supply line. The first electrode and the second electrode are closer to the liquid crystal layer than the voltage supply line, and the first electrode and the second electrode are arranged in either the first direction or a second direction crossing the first direction. Further, a first voltage supplied to the first electrode is different from a second voltage supplied to the second electrode.

Embodiments will be described hereinafter will reference to the accompanying drawings.

The disclosure is merely an example, and proper changes in keeping with the spirit of the invention, which are easily conceivable by a person of ordinary skill in the art, come within the scope of the invention as a matter of course. In addition, in some cases, in order to make the description clearer, the drawings are schematically, rather than as an accurate representation of what is implemented, illustrated. However, such schematic illustration is merely exemplary and in no way restricts the interpretation of the invention. In the drawings, reference numbers of continuously arranged elements equivalent or similar to each other are omitted in some cases. In addition, in the specification and drawings, structural elements equivalent or similar to those described in connection with preceding drawings are denoted by the same reference numbers, and detailed description thereof is omitted unless necessary.

In each embodiment, a liquid crystal display device will be disclosed as an example of the display device. However, each embodiment does not preclude the application of individual technical ideas disclosed in the embodiment to various other display devices.

First Embodiment

FIG. 1 is a plan view of a structural example of a display device 1 of the first embodiment. The display device 1 includes a first substrate SUB1 (array substrate) and a second substrate SUB2 (counter-substrate) which is opposed to the first substrate SUB1. These substrates SUB1 and SUB2 are attached to each other by a sealant SL. Between these substrates SUB1 and SUB2, a liquid crystal layer LC is sealed in a space which is enclosed with the sealant SL.

The display device 1 includes a display area DA and a surrounding area SA outside the display area DA. The first substrate SUB1 includes an output area TA which is not opposed to the second substrate SUB2. A driver IC 2 is mounted in the output area TA. In planar view, the surrounding area SA overlaps a light-shielding layer 3 which is formed in the second substrate SUB2.

The display device 1 includes a first scan driver GD1, a second scan driver GD2 and a video driver SD. These drivers GD1, GD2 and SD are located in the surrounding area SA and provided, for example, in the first substrate SUB1. In FIG. 1, the first scan driver GD1 is provided on the left side of the display area DA, and the second scan driver GD2 is provided on the right side of the display area DA. The video driver SD is located between the display area DA and the output area TA. Note that the display device 1 may include only one scan driver instead. Further, the video driver SD may be provided outside the display device 1 and may be connected to the display device 1 via a flexible printed circuit.

The display device 1 includes scanning signal lines G and video signal lines S which cross the scanning signal lines G. The scanning signal lines G extend in an X direction and are arranged side by side in a Y direction which crosses the X direction. The video signal lines S extend in the Y direction and are arranged side by side in the X direction. It is assumed that the X direction and the Y direction orthogonally cross each other. For example, counting from the uppermost scanning signal lines G shown in FIG. 1, the odd-numbered scanning signal lines G are connected to the first scan driver GD1, and the even-numbered scanning signal lines G are connected to the second scan driver GD2. Each of the video signal lines S is connected to the video driver SD. Each of the scan drivers GD1 and GD2 supplies a scanning signal to each of the corresponding scanning signal lines G. The video driver SD supplies a video signal to each of the video signal lines S.

The display device 1 includes a voltage supply line 4 in the surrounding area SA. In the present embodiment, the voltage supply line 4 includes a first power supply line 41 and a second power supply line 42. In the example shown in FIG. 1, each of the power supply lines 41 and 42 surrounds the display area DA, and both ends thereof are connected to the driver IC 2. In planar view, the first power supply line 41 is located between the second power supply line 42 and the display area DA. As another example, the second power supply line 42 may be located between the first power supply line 41 and the display area DA.

In the present embodiment, the driver IC 2 supplies a first voltage V1 to the first power supply line 41 and a second voltage V2 which is different from the first voltage V1 to the second power supply line 42. Power circuits which generate these voltages V1 and V2 may be provided in the display device 1 or may be provided outside the display device 1.

For example, the first voltage V1 is a voltage VGL which has first polarity, and the second voltage V2 is a voltage VGH which has second polarity which is different from the first polarity. In the present embodiment, the first polarity is assumed to be negative, and the second polarity is assumed to be positive. Each of the scan drivers GD1 and GD2 selectively supplies either of the voltages V1 and V2 to the scanning signal line G.

The display device 1 includes a large number of sub-pixel areas PX which are defined by the scanning signal lines G and the video signal lines S. Each of the sub-pixel areas PX is an area corresponding to a sub-pixel which displays a specific color such as red, green, blue, white or the like. A pixel as the smallest color display unit is composed of sub-pixels corresponding to different colors.

Each of the sub-pixel areas PX includes a switching element SW which is connected to the scanning signal line G and the video signal line S, and a pixel electrode PE which is connected to the switching element SW. The first voltage V1 is off-voltage for the switching element SW, and the second voltage V2 is on-voltage for the switching element SW. That is, when the second voltage V2 is supplied to the scanning signal line G corresponding to a certain switching element SW, the switching element SW is turned on. At that time, the video signal line S and the pixel electrode PE which correspond to the switching element SW are electrically connected to each other, and then the video signal is supplied from the video signal line S to the pixel electrode PE. As the video signal is supplied to the pixel electrode PE, an electric field which acts on the liquid crystal layer LC is generated between the pixel electrode PE and the common electrode CE which extends across the sub-pixel areas PX.

FIG. 2 is a schematic diagram showing a structural example of the first scan driver GD1. Note that a structure similar to that of the first scan driver GD1 which will be described below is also applicable to the structure of the second scan driver GD2.

The first scan driver GD1 includes a shift register circuit SR and gate switch circuits GSW. The scanning signal lines G are connected to the gate switch circuits GSW, respectively. In the example shown in FIG. 2, the first power supply line 41 and the second power supply line 42 extend between the shift register circuit SR and the gate switch circuits GSW.

The shift register circuit SR sequentially outputs a shift pulse to the gate switch circuits GSW. When the shift pulse is not input to the gate switch circuit GSW, the gate switch circuit GSW outputs the first voltage V1, which is supplied to the first power supply line 41, to the corresponding scanning signal line G. On the other hand, when the shift pulse is input to the gate switch circuit GSW, the gate switch circuit GSW outputs the second voltage V2, which is supplied to the second power supply line 42, to the corresponding scanning signal line G.

In the display device 1 of the above-described structure, ions resulting from impurities in the liquid crystal layer LC and ions dissolved from the sealant SL are mixed in the liquid crystal layer LC. It is known that these ions are concentrated into the corners of the area which is enclosed with the sealant SL as the display device 1 is driven. If the impact of the concentrated ions reaches the display area DA, the effective voltage of the liquid crystal layer LC will decrease, and the decrease in the effective voltage will lead to negative effects such as dark spots on the image displayed in the display area DA.

The display device 1 of the present embodiment has a structure for preventing degradation in display quality caused by ions in the liquid crystal layer LC. An example of the structure will be described below.

Figure 3:
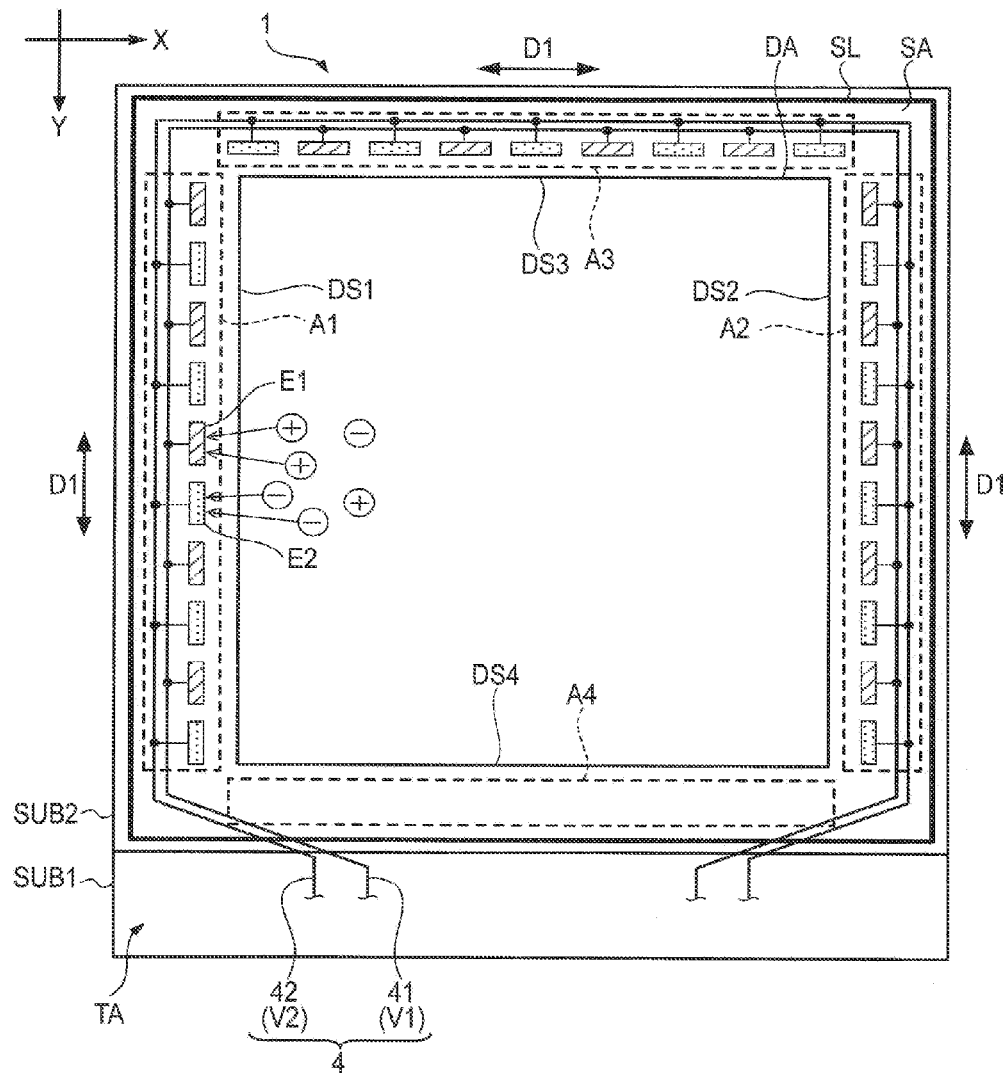
FIG. 3 is a schematic plan view of the display device.

FIG. 3 is a schematic plan view of the display device 1. Here, some of the elements shown in FIG. 1 are omitted. The display area DA has a first side DS1, a second side DS2 opposite to the first side DS1, a third side DS3, and a fourth side DS4 opposite to the third side DS3. The fourth side DS4 is located at the side of the output area TA.

The surrounding area SA includes a first area A1 between the first side DS1 and the sealant SL, a second area A2 between the second side DS2 and the sealant SL, a third area A3 between the third side DS3 and the sealant SL, and a fourth area A4 between the fourth side DS4 and the sealant SL. The areas A1, A2 and A4 are where the first scan driver GD1, the second scan driver GD2 and the video driver SD shown in FIG. 1 are provided, respectively. The first area A1 and the second area A2 face each other across the display area DA. The third area A3 and the fourth area A4 are arranged side by side in a direction (Y direction) which is different from a direction (X direction) in which the first area A1 and the second area A2 are arranged side by side, and face each other across the display area DA.

The display device 1 includes first electrodes E1 and second electrodes E2. These first electrodes E1 and second electrodes E2 are provided in all the areas A1 to A3 of the surrounding area SA. The fourth area A4 is occupied with various conductive lines and circuits including the video driver SD and does not have much room for the electrodes E1 and E2. Therefore, the electrodes E1 and E2 are not provided in the fourth area A4 in the example shown in FIG. 3.

Hereinafter, the extension direction of the voltage supply line 4 (each of the power supply lines 41 and 42) in the areas A1 to A3 will be referred to as a first direction D1. For example, the first direction D1 in the first area A1 and the second area A2 corresponds to the extension direction (Y direction) of the video signal line S, while the first direction D1 in the third area A3 corresponds to the extension direction (X direction) of the scanning signal line G.

In each of the areas A1 to A3, the electrodes E1 and E2 are alternately arranged in the first direction D1. Although the electrodes E1 and E2 are linearly arranged in FIG. 3, the electrodes E1 and E2 may be misaligned with each other in a direction crossing the first direction D1.

Each of the first electrodes E1 is connected to the first power supply line 41. Each of the second electrodes E2 is connected to the second power supply line 42. That is, the first voltage V1 is supplied to the first electrode E1, and the second voltage V2 is supplied to the second electrode E2.

The liquid crystal layer LC, positive ions (+) and negative ions (−) are mixed with each other. The positive ions are drawn to the first electrode E1 to which the negative-polarity first voltage V1 is applied. The negative ions are drawn to the second electrode E2 to which the positive-polarity second voltage V2 is applied. In this way, it is possible, by trapping the positive ions and the negative ions by the electrodes E1 and E2 which are provided across the surrounding area SA, to prevent these ions from being concentrated into specific portions.

Next, the sectional structure of the display device 1 will be described with reference to FIG. 4. The first substrate SUB1 includes a first insulating substrate 10, a first insulating layer 11, a second insulating layer 12, a third insulating layer 13, a fourth insulating layer 4, a fifth insulating layer 15, and a first alignment film 16. Further, the first substrate SUB1 includes in the display area DA, the scanning signal line G, the video signal line S, the switching element SW, the pixel electrode PE and the common electrode CE, and includes in the surrounding area SA, the first power supply line 41, the second power supply line 42, the first electrode E1 and the second electrode E2.

A semiconductor layer SC of the switching element SW is formed on a surface of the first insulating substrate 10 at the side of the second substrate SUB2, and the surface of the first insulating substrate 10 and the semiconductor layer SC are covered with the first insulating layer 11. The scanning signal line G and the power supply lines 41 and 42 are formed on the first insulating layer 11. The first insulating layer 11, the scanning signal line G and the power supply lines 41 and 42 are covered with the second insulating layer 12. A relay electrode RE of the switching element SW and the video signal line S are formed on the second insulating layer 12. The video signal line S and the relay electrode RE are in contact with the semiconductor layer SC via contact holes which are formed in the insulating layers 11 and 12.

The second insulating layer 12, the relay electrode RE and the video signal line S are covered with the third insulating layer 13. The third insulating layer 13 is covered with the fourth insulating layer 14 which is formed of an organic material. The common electrode CE is formed on the fourth insulating layer 14. The fourth insulating layer 14 and the common electrode CE are covered with the fifth insulating layer 15. The pixel electrode PE, the first electrode E1 and the second electrode E2 are formed on the fifth insulating layer 15. The pixel electrode PE is in contact with the relay electrode RE via a contact hole formed in the insulating layers 13 to 15.

The first electrode E1 is connected to the first power supply line 41 via a first contact hole CH1 formed in the insulating layers 12 to 15. The second electrode E2 is connected to the second power supply line 42 via a second contact hole CH2 formed in the insulating layers 12 to 15. The fifth insulating layer 15, the pixel electrode PE and the electrodes E1 and E2 are covered with the first alignment film 16. The first alignment film 16 is in contact with the liquid crystal layer LC.

As described above, the electrodes E1 and E2 are closer to the liquid crystal layer LC than the power supply lines 41 and 42. In this way, the electric field of the electrodes E1 and E2 effectively acts on the liquid crystal layer LC, and thus the electrodes and E2 can excellently trap ions in the liquid crystal layer LC. Particularly, in the example shown in FIG. 4, the electrodes E1 and E2 are located closer to the liquid crystal layer LC than the fourth insulating layer 14 which is the thickest among the insulating layers 11 to 15. Therefore, the ion-trapping performance of the electrodes E1 and E2 can be further improved.

The second substrate SUB2 includes a second insulating substrate 20, a color filter layer 21, an overcoat layer 22, a second alignment film 23, and the above-described light-shielding layer 3. The light-shielding layer 3 is formed on a surface of the second insulating substrate 20 at the side of the first substrate USB1, and the surface of the second insulating substrate 20 and the light-shielding layer 3 are covered with the color filter layer 21. The color filter layer 21 is covered with the overcoat layer 22. The overcoat layer 22 is covered with the second alignment film 23. The second alignment film 23 is in contact with the liquid crystal layer LC.

The light-shielding layer 3 is provided not only in the surrounding area SA but also in the display area DA. The light-shielding layer 3 in the display area DA is opposed to the switching element SW, the scanning signal line G and the video signal line S. In general, the light-shielding layer 3 in the display area DA is formed in the shape of a matrix.

The pixel electrode PE, the common electrode CE and the electrodes E1 and E2 are formed of, for example, a transparent conductive material such as indium tin oxide (ITO).

The scanning signal line G, the video signal line S, the relay electrode RE and the power supply lines 41 and 42 are formed of, for example, a metal material.

Figure 4:
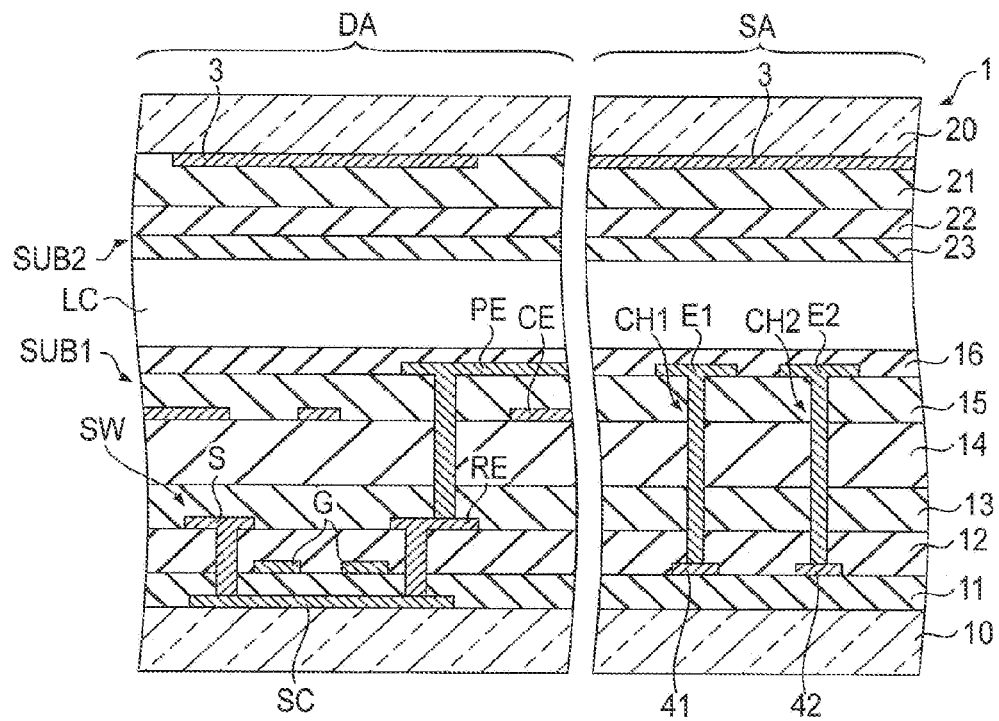
FIG. 4 is a schematic sectional view of the display device.

In the example shown in FIG. 4, each of the power supply lines 41 and 42 and the scanning signal line G are formed in the same layer as each other. However, each of the power supply lines 41 and 42 and the scanning signal line G may be formed in different layers from each other and instead, for example, each of the power supply lines 41 and 42 and the video signal line S may be formed in the same layer as each other. Further, the power supply lines 41 and 42 may be formed in different layers from each other.

In the example shown in FIG. 4, each of the electrodes E1 and E2 and the pixel electrode PE are formed in the same layer and covered with the first alignment film 16. However, each of the electrodes E1 and E2 may not be covered with the first alignment film 16 but may be exposed to the liquid crystal layer LC. Further, each of the electrodes E1 and E2 and the pixel electrode PE may be formed in different layers from each other and instead, for example, each of the electrodes E1 and E2 and the common electrode CE may be formed in the same layer as each other. Further, the electrodes E1 and E2 may be formed in different layers from each other.

The electrodes E1 and E2 can be formed of a metal material. For example, these electrodes E1 and E2 of the metal material can be formed on the fourth insulating layer 14. In the process of forming the electrodes E1 and E2, it is also possible to form a metal line on the common electrode CE in such a way as to be opposed to the video signal line S by using the same material. When the metal line is provided, the resistance of the common electrode CE can be reduced.

Next, certain examples of the planar arrangement and shape of the electrodes E1 and E2 and the power supply lines 41 and 42 will be described with reference to FIGS. 5 to 7. Each of the drawings schematically illustrates the display area DA, and the electrodes E1 and E2 and the power supply lines 41 and 42 provided in the first area A1. Note that, since a structure similar to that of the first area A1 can be applied to the second area A2 and the third area A3, detailed description thereof will be omitted unless necessary. Further, in each of the drawings, a direction orthogonal to the first direction D1 is defined as a second direction D2. For example, the second direction D2 corresponds to the extension direction (X direction) of the scanning signal line G in the first area A1 and the second area A2 shown in FIG. 3 and corresponds to the extension direction (Y direction) of the video signal in the third area A3 shown in FIG. 3.

First Example

Figure 5:
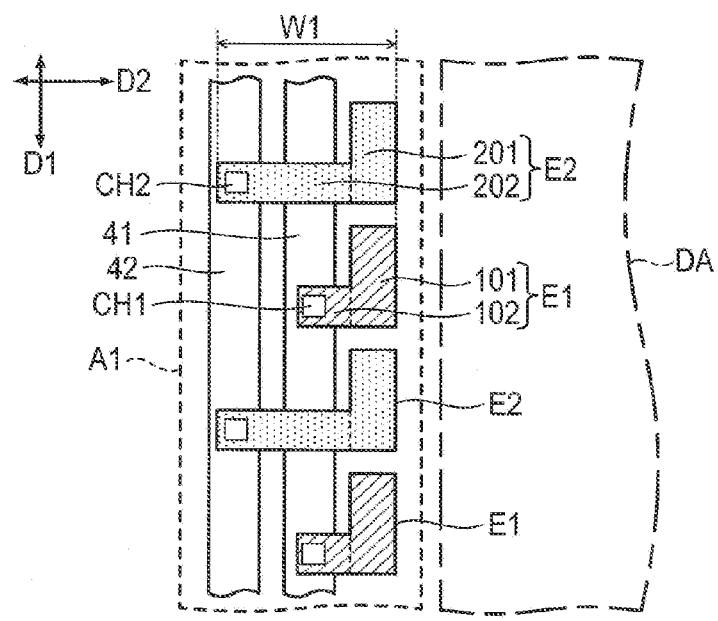
FIG. 5 is a diagram showing a first example.

FIG. 5 is a diagram showing a first example. In the example shown in the drawing, the first electrode E1 includes a first main portion 101 and a first connection portion 102. Further, the second electrode E2 includes a second main portion 201 and a second connection portion 202. The first main portion 101 and the first connection portion 102 are connected to each other in the shape of a letter L. The first main portion 101 and the first connection portion 102 may be connected to each other, for example, in the shape of a letter T or in various other ways. Similarly, the second main portion 201 and the second connection portion 202 are connected to each other in the shape of a letter L but may also be connected to each other, for example, in the shape of a letter T or in various other ways.

The first main portion 101 and the second main portion 201 are located between the first power supply line 41 and the display area DA and are elongated in the first direction D1. The first connection portion 102 extends in the second direction D2 from the first main portion 101 to a position where the first main portion 101 overlaps the first power supply line 41, and is connected to the first power supply line 41 via the first contact hole CH1. The second connection portion 202 extends in the second direction D2 from the second main portion 201 to a position where the second main portion 201 overlaps the second power supply line 42, and is connected to the second power supply line 42 via the second contact hole CH2.

The main portion 101 and the second main portion 201 are alternately and linearly arranged in the first direction D1. The first main portion 101 and the second main portion 201 have, for example, the same length as each other in the first direction D1 and the same width as each other in the second direction D2. Note that the first main portion 101 and the second main portion 201 may have different lengths and widths from each other. In general, the ions resulting from impurities in the liquid crystal display device are largely positive ions. Therefore, the length of the first main portion 101 in the first direction D1 may be set to be greater than the length of the second main portion 201 in the first direction D1. The same also applies to the other embodiments. Since the first power supply line 41 is provided between the second power supply line 42 and the display area DA, the length of the first connection portion 102 in the second direction D2 is less than the length of the second connection portion 202 in the second direction D2. In the present embodiment, the overall width of the electrodes E1 and E2 in the second direction D2 is greater than the overall width of the power supply lines 41 and 42 in the second direction D2.

An electrode array of the alternately-arranged electrodes E1 and E2 has a width W1. In FIG. 5, the width W1 corresponds to the distance in the second direction D2 from the end of each of the electrodes E1 and E2 at the side of the display area DA to the end of the second electrode E2 at the opposite side to the side of the display area DA.

In the first embodiment, the electrodes E1 and E2 are located closer to the display area DA than the power supply lines 41 and 42. In this case, ions in the liquid crystal layer LC in the display area DA will be drawn to the electrodes E1 and E2 without being affected by an electric field generated by the power supply lines 41 and 42. Therefore, the trapping performance of each of the electrodes E1 and E2 can be enhanced.

Second Example

Figure 6:
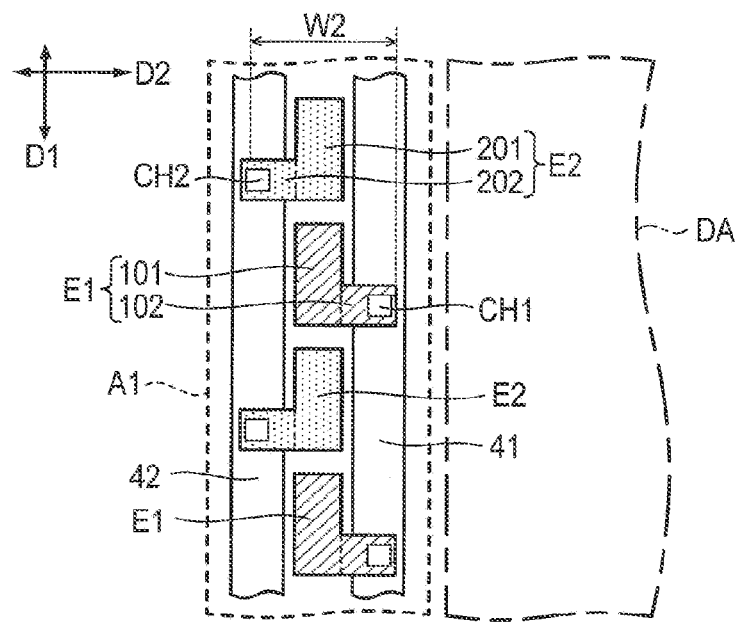
FIG. 6 is a diagram showing a second example.

FIG. 6 is a diagram showing a second example. The second example is different from the first example in that the first main portion 101 and the second main portion 201 are arranged between the power supply lines 41 and 42 in planar view.

In FIG. 6, the length of the first connection portion 102 in the second direction D2 is the same as the length of the second connection portion 202 in the second direction D2. Note that these lengths may be different from each other. An electrode array of the alternately-arranged electrodes E1 and E2 has a width W2. In FIG. 6, the width W2 corresponds to the distance in the second direction D2 from the end of the first electrode E1 at the side of the display area DA to the end of the second electrode E2 at the opposite side to the side of the display area DA.

In the second example, the electrodes E1 and E2 are arranged between the power supply lines 41 and 42. Therefore, the width w2 of the electrode array will not be greater than the overall width of the power supply lines 41 and 42. If the distance between the power supply lines 41 and 42 in the first example is assumed to be the same as that of the second example, the width W2 is less than the width W1.

Third Example

Figure 7:
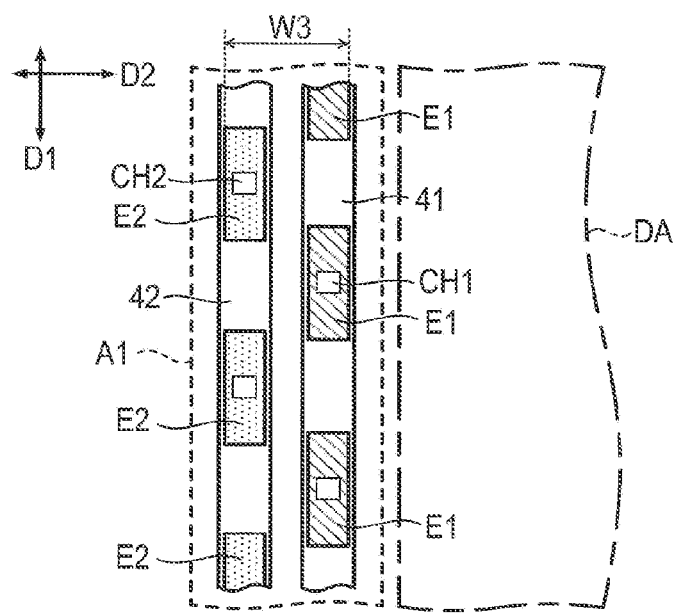
FIG. 7 is a diagram showing a third example.

FIG. 7 is a diagram showing a third example. The third example is different from the first and second examples in that the first electrode E1 is provided directly above the first power supply line 41 and the second electrode E2 is provided directly above the second power supply line 42.

The electrodes E1 and E2 are elongated in the first direction D1. In FIG. 7, the electrodes E1 and E2 have the same length as each other in the first direction D1 and the same width as each other in the second direction D2. Note that the electrodes E1 and E2 may have different lengths and widths from each other. In FIG. 7, the width of each of the electrodes E1 and E2 in the second direction D2 is less than the width of each of the power supply lines 41 and 42 in the second direction D2. Note that the width of each of the electrodes E1 and E2 may be greater than the width of each of the power supply lines 41 and 42 or may be the same as the width of each of the power supply lines 41 and 42.

As in the case with the other examples, the electrodes E1 and E2 are alternately arranged in the first direction D1. However, in the third example, each of the first electrodes E1 and each of the second electrodes E2 are misaligned with each other in the second direction D2. An electrode array of the alternately-arranged electrodes E1 and E2 has a width W3. In FIG. 7, the width W3 corresponds to the distance in the second direction n2 from the end of the first electrode E1 at the side of the display area DA to the end of the second electrode E2 at the opposite side to the side of the display area DA.

In the third example, the electrodes E1 and E2 are provided directly above the power supply lines 41 and 42, respectively. Therefore, the electrodes E1 and E2 can be reduced in width. Such electrodes E1 and E2 are advantageous when there is not much room for arranging the electrodes E1 and E2.

Further to the structures of the first to third examples, the electrodes E1 and E2 can be modified in various other ways. In any of the first to third examples, the electrodes E1 and E2 are alternately arranged in the first direction D1. According to this structure, positive ions in the liquid crystal layer LC can be drawn to the negative-polarity first electrode E1 without interference from the positive-polarity second electrode E2. Similarly, negative ions in the liquid crystal layer LC can be drawn to the positive-polarity second electrode E2 without interference from the negative-polarity first electrode E1.

As positive ions and negative ions are trapped respectively by the electrodes E1 and E2 which are provided across the surrounding area SA, the ions will not be concentrated into specific portions but will be spread across the surrounding area SA. Therefore, dark spots associated with such concentrations of ions or the like can be prevented, and display quality can be improved.

Further, in the present embodiment, the first power supply line 41 and the second power supply line 42 which supply voltage respectively to the scan drivers GD1 and GD2 are used as the voltage supply line 4 which voltage to each of the electrodes E1 and E2. Therefore, additional power supply lines for the electrodes E1 and E2 are not required. Consequently, the surrounding area SA can be reduced in size.

Note that, in the present embodiment, the electrodes E1 and E2 are not provided in the fourth area A4. However, the electrodes E1 and E2 may also be provided in the fourth area A4.

In the areas A1 to A4, the shape and arrangement of each of the electrodes E1 and E2 may differ from one area to another. In this case, for example, a first width of the electrode array in either the first area A1 or the second area A2 may be different from a second width of the electrode array in either the third area A3 or the fourth area A4.

As one example, the third example may be applied to the first and second areas A1 and A2 which are occupied with the scan drivers GD1 and GD2 and have limited room for arranging the electrodes E1 and E2, while either the first example or the second example may be applied to the third area A3 which has enough room for arranging the electrodes E1 and E2. In this case, the first width of the electrode array in each of the first and second areas A1 and A2 will be the width W3, while the second width of the electrode array in the third area A3 will be either the width W1 or the width W2.

In the case of further providing the electrodes E1 and E2 in the fourth area A4, in consideration of the video driver SD provided in the fourth area A4, the third example may be applied to the fourth area A4 as in the case with the first and second areas A1 and A2. If the fourth area A4 has sufficient from for arranging the electrodes E1 and E2, either the first example or the second example may be applied to the fourth area A4 as in the case with the third area A3.

Further, in consideration of the arrangement space and the layer structure of each of the areas A1 to A4, each of the electrodes E1 and E2 in each of the areas A1 to A4 may be formed into various other shapes and arranged in various other manners. Further, the electrodes E1 and E2 may be formed in different shapes and arranged in different manners within one area.

In the present embodiment, the electrodes E1 and E2 are alternately arranged such that the cycle of one electrode E1 and one electrode E2 is repeated. However, the electrodes E1 and E2 may be alternately arranged such that the cycle of several first electrodes E1 and several second electrodes E2 is repeated. Further, in general, the liquid crystal display device tends to generate positive ions as impurities, and thus the number of the first electrodes E1 may be set to be greater than the number of the second electrodes E2.

Still further, the present embodiment can be modified in various other ways.

Second Embodiment

The second embodiment will be described. In the following, the same structural elements as those of the first embodiment will be denoted by the same reference numbers, and detailed description thereof will be omitted.

Figure 8:
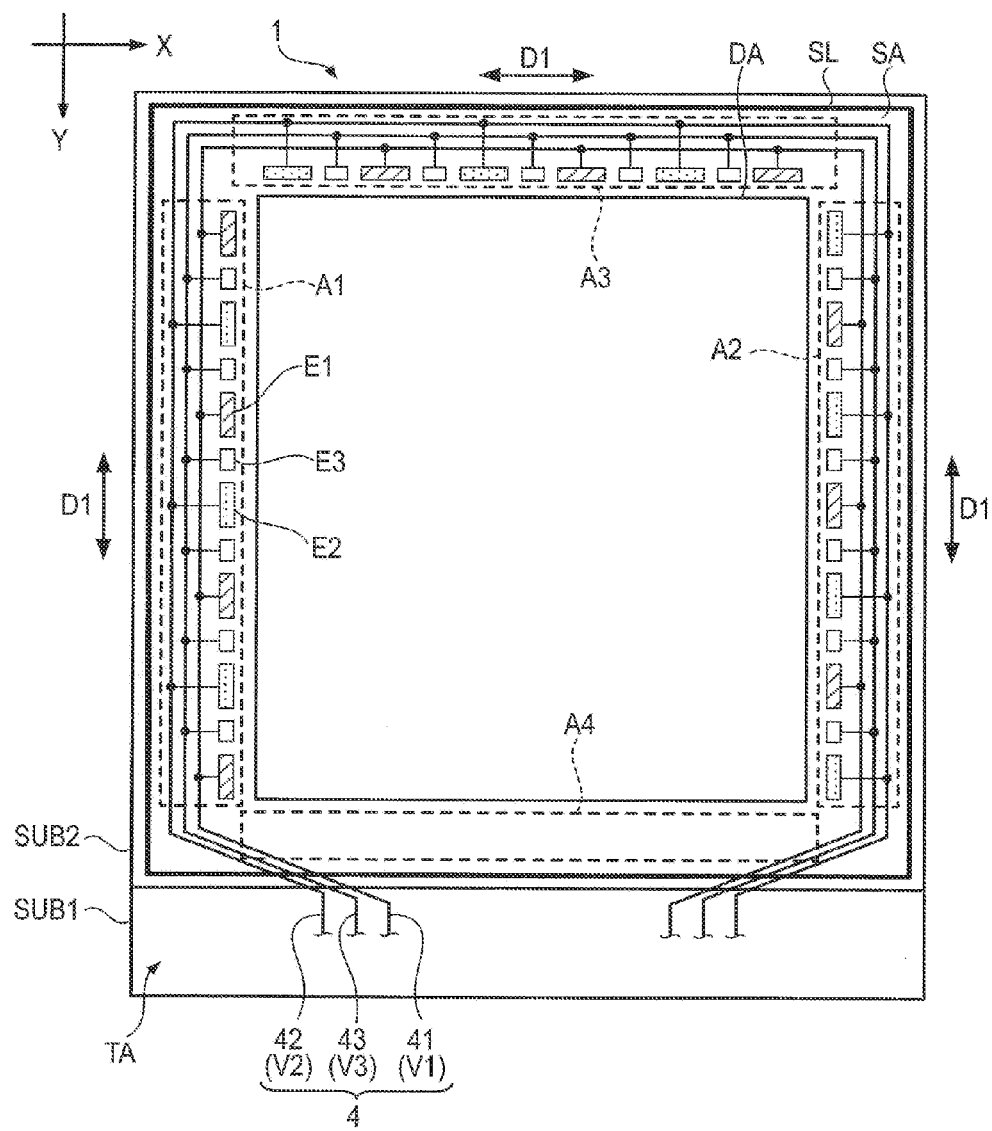
FIG. 8 is a schematic plan view of a display device of a second embodiment.

FIG. 8 is a schematic plan view of the display device 1 of the second embodiment. In the example shown in the drawing, a third electrode E3 is further provided between the first electrode E1 and the second electrode E2 in each of the areas A1 to A3. These electrodes E1 to E3 are alternately arranged in the first direction D1. Although the electrodes E1 to E3 are linearly arranged in FIG. 8, the electrodes E1 to E3 may also be misaligned with each other in a direction crossing the first direction D1.

The voltage supply line 4 further includes a third power supply line 43. The third power supply line 43 surrounds the display area DA in the same manner as those of the power supply lines 41 and 42, and both ends thereof are connected to the driver IC 2. In the example shown in FIG. 8, the third power supply line 43 is located between the first power supply line 41 and the second power supply line 42. Note that the third power supply line 43 may be provided between the first power supply line 41 and the display area DA or may be provided between the second power supply line 42 and the sealant SL.

A third voltage V3 is supplied to the third power supply line 43. The third voltage V3 is intermediate between the first voltage V1 and the second voltage V2. For example, the third voltage V3 is common voltage VCOM to be supplied to the common electrode CE. Note that the third voltage V3 may be another voltage such as ground potential. The third electrode E3 is connected to the third power supply line 43. Therefore, the third voltage V3 is applied to the third electrode E3.

The third power supply line 43 can be formed of the same metal material as that of the power supply lines 41 and 42 on the first insulating layer 11 shown in FIG. 4. Further, the third electrode E3 can be formed on the fifth insulating layer 15 shown in FIG. 4 together with the electrodes E1 and E2 and connected to the third power supply line 43 via a third contact hole (contact hole CH3 which will be described later). Note that the third power supply line 43 and each of the power supply lines 41 and 42 may be formed in different layers from each other. Further, the third electrode E3 and each of the electrodes E1 and E2 may be formed in different layers from each other and instead, for example, the third electrode E3 may be formed on the fourth insulating layer 14 shown in FIG. 4.

Next, the effect of the third electrode E3 will be described. If the third electrode E3 is not provided, a high electric field is generated between the electrodes E1 and E2 to which voltages of different polarity are supplied, and this electric field will reduce the electric field to be applied to the liquid crystal layer LC from each of the electrodes E1 and E2. In this case, the ion-trapping performance of each of the electrodes E1 and E2 will be declined.

On the other hand, if the third electrode E3 is provided, electric fields are generated between the electrodes E1 and E3 and also generated between the electrodes E2 and E3. Both the potential difference between the first voltage V1 and the third voltage V3 and the potential difference between the second voltages V2 and the third voltage 3 are less than the potential difference between the first voltage V1 and the second voltage V2. Therefore, both the electric field between the electrodes E1 and E3 and the electric field between the electrodes E2 and E3 will be less than the electric field between the electrodes E1 and E2 which is generated when the third electrode E3 is not provided. In this way, the electric field to be applied to the liquid crystal layer LC from each of the electrodes E1 and E2 will remain high.

Figure 9:
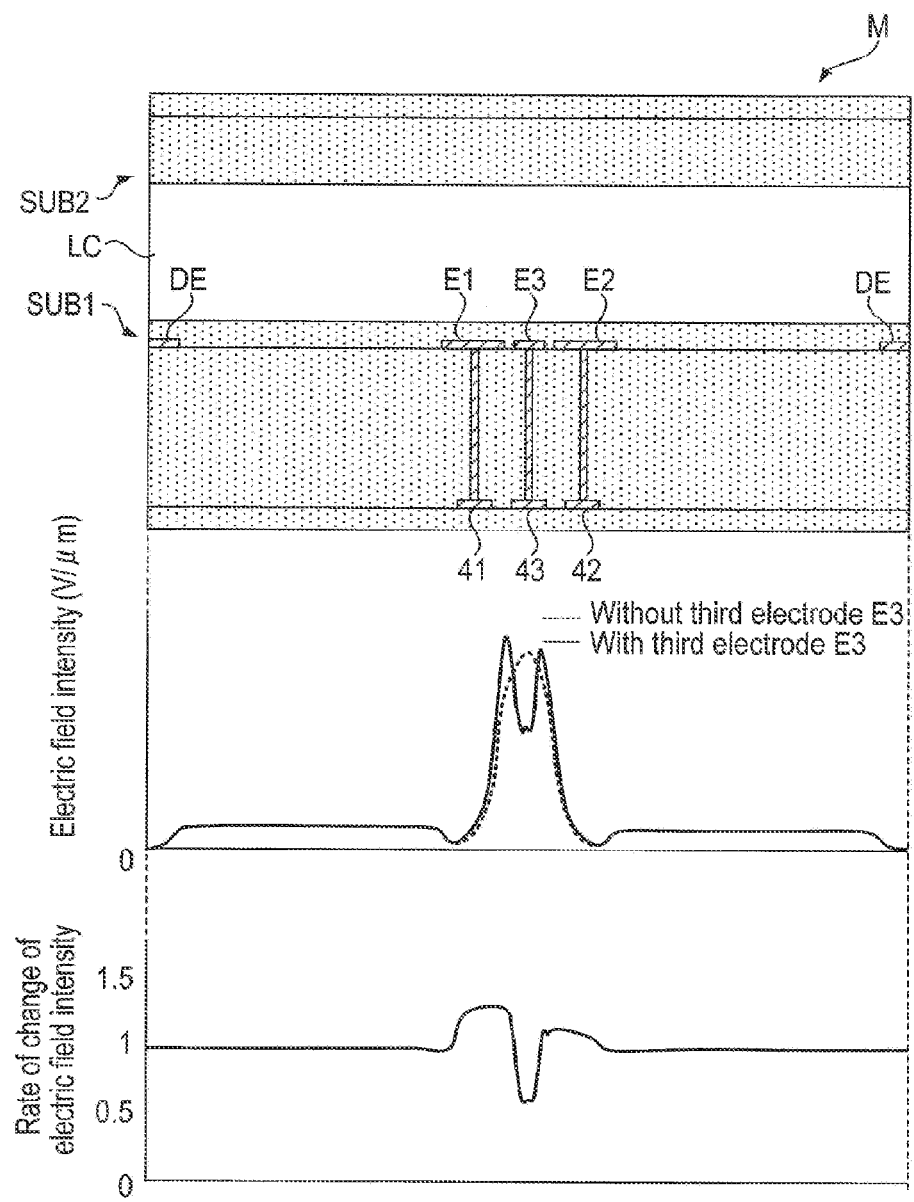
FIG. 9 is a diagram showing an effect of a third electrode.

The above-described effectiveness of the third electrode E3 is proven by simulation, and the result of the simulation is shown in FIG. 9. A simulation model M shown in the top row in the drawing includes the first substrate SUB1, the second substrate SUB2, and the liquid crystal layer LC. Further, the first substrate SUB1 includes the electrodes E1 to E3, the power supply lines 41 to 43 which are provided below these electrodes E1 to E3, and a pair of dummy electrodes DE which is provided in the same layer together with the electrodes E1 to E3. In the simulation, the dummy electrode DE is provided for convergence of the electric field of each of the electrodes E1 and E2. The voltage supplied to the first electrode E1 and the first power supply line 41 is the first voltage V1, the voltage supplied to the second electrode E2 and the second power supply line 42 is the second voltage V2, and the voltage supplied to the third electrode E3 and the third power supply line 43 is the third voltage V3. Further, the voltage supplied to the dummy electrode DE is ground potential.

In the graph shown in the middle row of FIG. 9, the solid curve indicates the intensity [V/μm] of the electric field to be generated in the simulation model M. The broken curve indicates the intensity [V/μm] of the electric field to be generated in the simulation model M where the third electrode E3 and the third power supply line 43 are removed.

The graph in the bottom row of FIG. 9 shows the rate of change of the intensity of the electric field to be generated when the third electrode E3 is provided with respect to the intensity of the electric field to be generated when the third electrode E3 is not provided. More specifically, the graph in the bottom row corresponds to the quotient of a value in the solid curve divided by a value in the broken curve in each position of the graph shown in the middle row. As is evident from the graph, the intensities of the electric fields near the electrodes E1 and E2 are improved when the third electrode E3 is provided. Consequently, the performance for trapping ions in the liquid crystal layer LC can be improved.

Next, certain examples of the planar arrangement and shape of each of the electrodes E1 to E3 and each of the power supply lines 41 to 43 will be described with reference to FIGS. 10 and 11.

Fourth Example

FIG. 10 shows a fourth embodiment. As in the case with the above-described first example, the first electrode E1 includes the first main portion 101 and the first connection portion 102, and the second electrode E2 includes the second main portion 201 and the second connection portion 202. Further, the third electrode E3 includes the third main portion 301 and the third connection portion 302. The third main portion 301 and the third connection portion 302 are connected to each other in the shape of a letter L. The third main portion 301 and the third connection portion 302 may be connected, for example, in the shape of a letter T or in various other ways.

The third power supply line 43 is located between the power supply lines 41 and 42. The third connection portion 302 extends up to the position above the third power supply line 43 and is connected to the third power supply line 43 via a third contact hole CH3.

Each of the main portions 101, 201 and 301 is located between the first power supply line 41 and the display area DA and is elongated in the first direction D1. These main portions 101, 201 and 301 are alternately and linearly arranged in the first direction D1. For example, the length of the third electrode E3 in the first direction D1 is less than the length of each of the electrodes E1 and E2 in the first direction D1. Note that the length of the third electrode E3 may be the same as the length of each of the electrode E1 and E2 or may be greater than the length of each of the electrodes E1 and E2.

Since the third power supply line 43 is provided between the power supply lines 41 and 42, the length of the third connection portion 302 in the second direction D2 is greater than the length of the first connection portion 102 in the second direction D2 and is less than the length of the second connection portion 202 in the second direction D2.

Fifth Example

FIG. 11 shows a fifth example. As in the case with the above-described third example, the first electrode E1 is arranged directly above the first power supply line 41, and the second electrode E2 is arranged directly above the second power supply line 42. Further, the third electrode E3 is arranged directly above the third power supply line 43. As in the case with the fourth example, the electrodes E1 to E3 are alternately arranged in the first direction D1. However, in the fifth example, the electrodes E1 to E3 are misaligned with each other in the second direction D2.

In FIG. 11, the width of each of the electrodes E1 to E3 in the second direction D2 is less than the width of each of the power supply lines 41 to 43 in the second direction D2. Note that the width of each of the electrodes E1 to E3 may be greater than the width of each of the power supply lines 41 to 43 or may be the same as the width of each of the power supply lines 41 to 43.

Further to the structures of the fourth and fifth examples, various other modifications can be made to each of the electrodes E1 to E3. The third electrode E3 may not be provided in every position between the electrodes E1 and E2. Further, the structure of the fourth example may be applied to any of the areas A1 to A4, while the structure of the fifth example may be applied to the rest of the areas A1 to A4. Still further, one of the first to fifth examples may be appropriately applied to each of the areas A1 to A4.

According to the above-described present embodiment, since the third electrode E3 is provided, the ion-trapping performance of each of the electrodes E1 and E2 can be improved. Therefore, the display quality of the display device 1 can be further improved.

Further, the same advantage as that of the first embodiment can be achieved from the present embodiment.

Third Embodiment

The third embodiment will be described. In the following, the same structural elements as those of the above-described embodiments will be denoted by the same reference numbers, and detailed description thereof will be omitted unless necessary.

Figure 12:
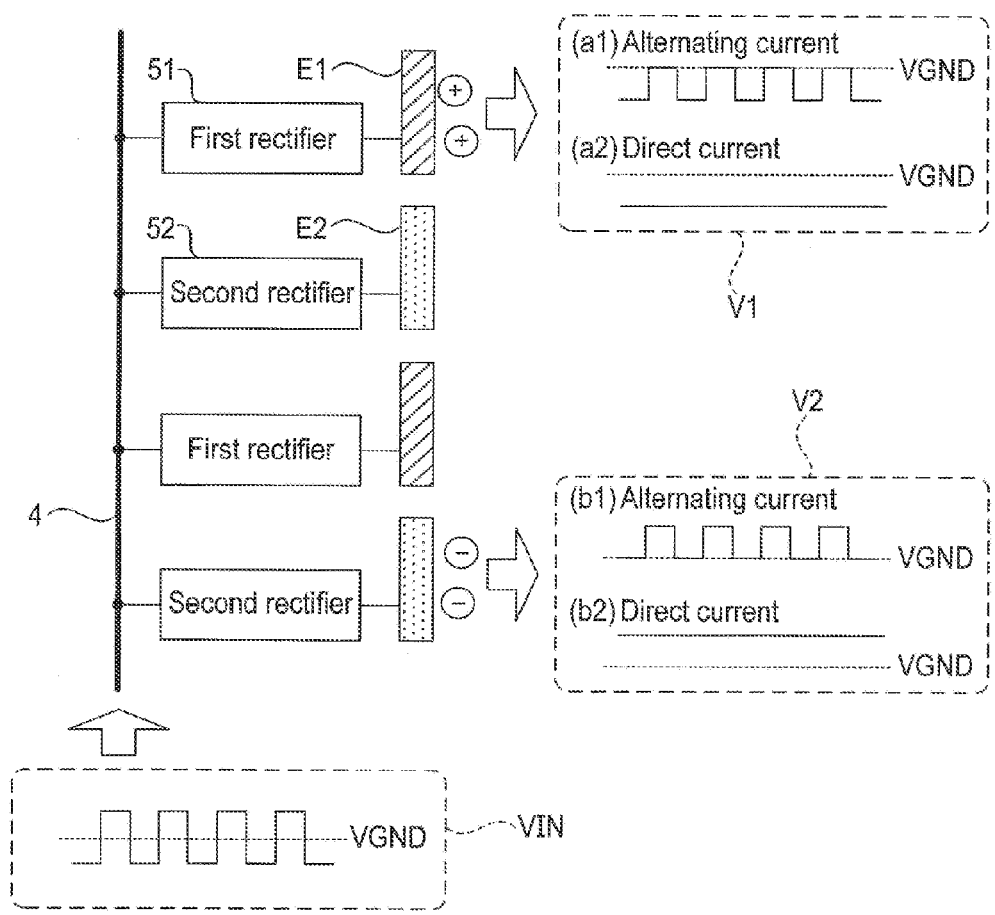
FIG. 12 is an explanatory diagram schematically showing a third embodiment.

FIG. 12 is an explanatory diagram schematically showing the third embodiment. In the present embodiment, an input voltage VIN is supplied to the voltage supply line 4. The voltage supply line 4 may be composed of several power supply lines. The input voltage VIN is alternating-current voltage which changes to the positive-polarity side and the negative-polarity side when centered, for example, on ground potential VGND. The first electrode E1 is connected to the voltage supply line 4 via a first rectifier 51. The second electrode E2 is connected to the voltage supply line 4 via the second rectifier 52.

For example, a diode can be used as each of the rectifiers 51 and 52. In this case, the cathode of the first rectifier 51 is connected to the voltage supply line 4, while the anode of the first rectifier 51 is connected to the first electrode E1. In this way, the first voltage V1 of the first electrode E1 is half-wave rectified to a negative-polarity alternating-current voltage as shown in (a1) in the drawing. Further, the anode of the second rectifier 52 is connected to the voltage supply line 4, and the cathode of the second rectifier 52 is connected to the second electrode E2. In this way, the second voltage V2 of the second electrode E2 is half-wave rectified to a positive-polarity alternating-current voltage as shown in (b1) in the drawing.

A bridge rectifier circuit may also be used as each of the rectifiers 51 and 52. In that case, as shown in (a2) and (b2) in the drawing, the first voltage V1 which is full-wave rectified to a negative-polarity direct-current voltage, and the second voltage V2 which is full-wave rectified to a positive-polarity direct-current voltage can be obtained.

In the preset embodiment, the video signal line S is used as the voltage supply line 4. In the frame inversion drive where the polarity of the drive voltage supplied to the sub-pixel areas PX is inverted frame by frame or the line inversion drive or the column inversion drive where the polarity of the drive voltage supplied to the sub-pixel areas PX is inverted line by line in the extension direction of the scanning signal line G or the video signal line S, an alternating-current video signal is applied to the video signal line S. This video signal corresponds to the above-described input voltage VIN.

Further, in the present embodiment, a pixel electrode which is provided in a dummy sub-pixel area (dummy pixel) is used as each of the electrodes E1 and E2. The dummy sub-pixel area is a sub-pixel area but makes no contribution to display and is adjacent to the sub-pixel area PX of the display area DA. In general, the outermost sub-pixel area PX tends to be electromagnetically affected by the influence of the surrounding circuits and lines. On the other hand, if the dummy sub-pixel area is provided, the electromagnetic influence on the outermost sub-pixel area PX can be suppressed. Further, the dummy sub-pixel area also protects the sub-pixel area PX from electrostatic breakdown.

Figure 13:
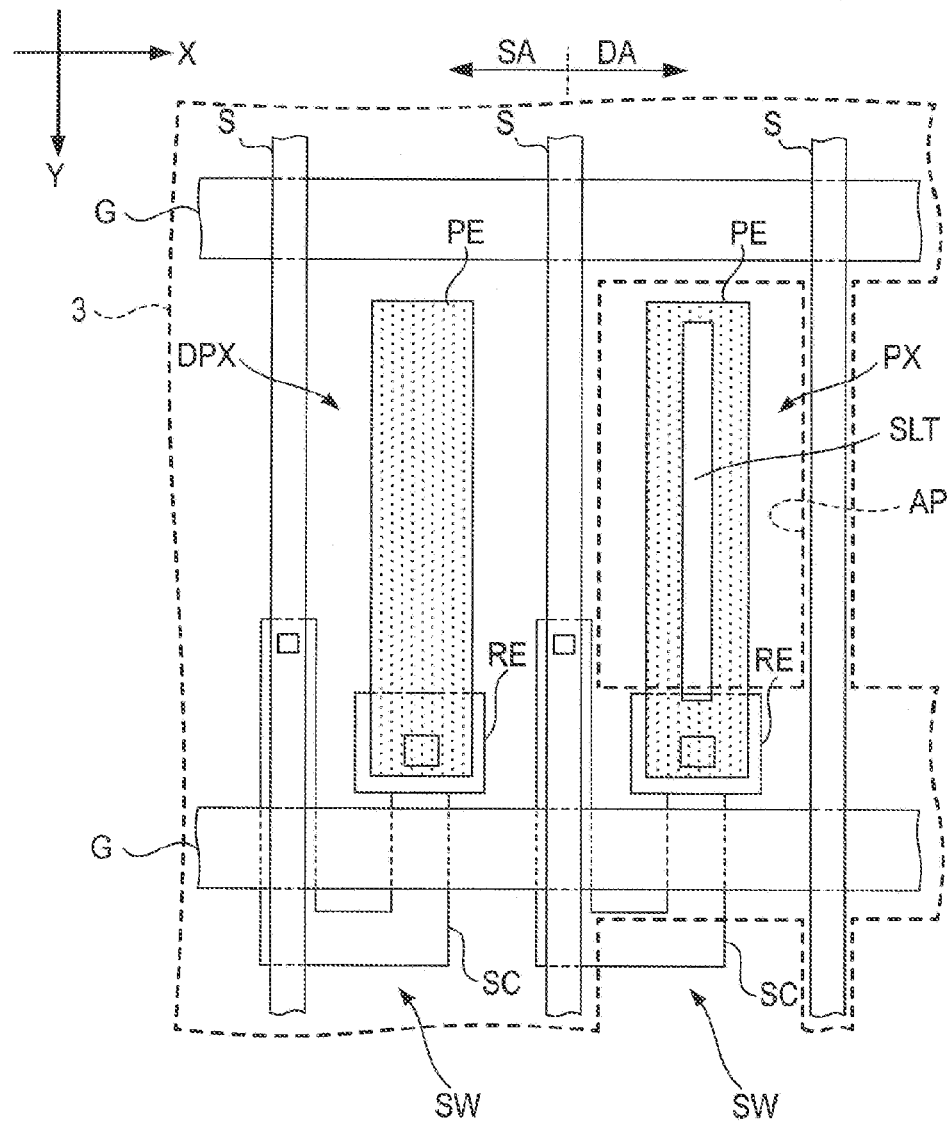
FIG. 13 is a plan view schematically showing the structure of a sub-pixel area and the structure of a dummy sub-pixel area.

FIG. 13 is a plan view schematically showing the structure of the sub-pixel area PX and the structure of the dummy sub-pixel area DPX. For example, the dummy sub-pixel area DPX is arranged in the surrounding area SA in such a way as to surround the display area DA.

As in the case with the sub-pixel area PX, the dummy sub-pixel area DPX includes the pixel electrode PE and the switching element SW. The semiconductor layer SC of the switching element SW is connected to the video signal line S and to the relay electrode RE. The relay electrode RE is connected to the pixel electrode PE. In the example shown in FIG. 13, the pixel electrode PE of the sub-pixel area PX has a slit SLT, whereas the pixel electrode PE of the dummy sub-pixel area DPX does not have any slit SLT.

In the display area DA, the light-shielding layer 3 overlaps the switching element SW, the scanning signal line G and the video signal line S. Further, the light-shielding layer 3 includes an aperture AP in the sub-pixel area PX. In the surrounding area SA, the light-shielding layer 3 does not include any aperture AP. That is, the dummy sub-pixel area DPX completely overlaps the light-shielding layer 3.

Next, certain examples of the structure for trapping ions in the liquid crystal layer LC using the dummy sub-pixel area DPX will be described with reference to FIGS. 14 to 18.

Sixth Example

Figure 14:
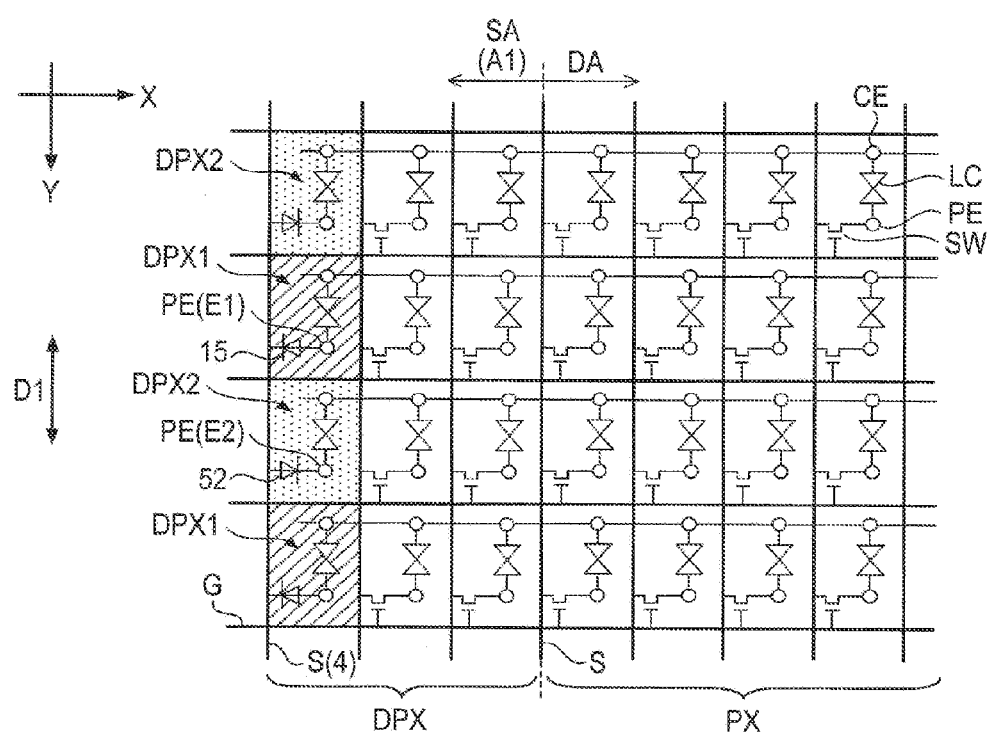
FIG. 14 is a diagram showing a sixth example.

FIG. 14 shows a sixth example. Here, the equivalent circuits of the sub-pixel area PX and the dummy sub-pixel area DPX in proximity to the boundary between the surrounding area (first area A1) and the display area DA are illustrated. In the present example, the leftmost video signal line S shown in FIG. 14 functions as the voltage supply line 4. That is, the first direction D1 is the extension direction (Y direction) of this video signal line S.

The dummy sub-pixel area DPX connected to the voltage supply line 4 includes a first dummy sub-pixel area DPX1 (first sub-pixel area) and a second dummy sub-pixel area DPX2 (second sub-pixel area). These dummy sub-pixel areas DPX1 and DPX2 are alternately arranged in the first direction D1. Each of the dummy sub-pixel areas DPX1 and DPX2 is different from the other dummy sub-pixel area DPX or the sub-pixel area PX (third sub-pixel area) in that each of the dummy sub-pixel areas DPX1 and DPX2 does not include any switching element SW.

The first dummy sub-pixel area DPX1 includes the first rectifier 51. The second dummy sub-pixel area DPX2 includes the second rectifier 52. In the present embodiment, the first rectifier 51 is a diode whose anode is connected to the pixel electrode PE and whose cathode is connected to the voltage supply line 4. Further, the second rectifier 52 is a diode whose anode is connected to the voltage supply line 4 and whose cathode is connected to the pixel electrode PE.

To the video signal line S (including the voltage supply line 4) corresponding to the dummy sub-pixel area DPX, for example, an alternating-current voltage similar to that of the video signal to be supplied to the video signal line S corresponding to the sub-pixel area PX is supplied. Note that the alternating-current voltage to be supplied to the voltage supply line 4 may be a signal having different amplitude and frequency from those of the video signal. For example, if the amplitude of the alternating-current voltage to be supplied to the voltage supply line 4 is set to be greater than that of the video signal, ion-trapping performance, which will be described later, improves.

The first rectifier 51 converts the alternating-current voltage supplied to the voltage supply line 4 to the negative-polarity first voltage V1 and supplies it to the pixel electrode PE of the first dummy sub-pixel area DPX1. Positive ions in the liquid crystal layer LC are trapped by the electric field of the pixel electrode PE to which the first voltage V1 is supplied traps. That is, the pixel electrode PE of the first dummy sub-pixel area DPX1 functions as the first electrode E1.

The second rectifier 52 converts the alternating-current voltage supplied to the voltage supply line 4 to the positive-polarity second voltage V2 and supplies it to the pixel electrode PE of the second dummy sub-pixel area DPX2. Negative ions in the liquid crystal layer LC are trapped by the electric field of the pixel electrode PE to which the second voltage V2 is supplied. That is, the pixel electrode PE of the second dummy sub-pixel area DPX2 functions as the second electrode E2. These electrodes E1 and E2 are alternately arranged in the first direction D1 in the same manner as that of the dummy sub-pixel areas DPX1 and DPX2.

In the example shown in FIG. 14, normal dummy sub-pixel areas DPX are interposed between each of the dummy sub-pixel areas DPX1 and DPX2 and the sub-pixel area PX. However, each of the dummy sub-pixel areas DPX1 and DPX2 may be adjacent to the sub-pixel area PX without any intervening normal dummy sub-pixel area DPX.

Seventh Example

Figure 15:
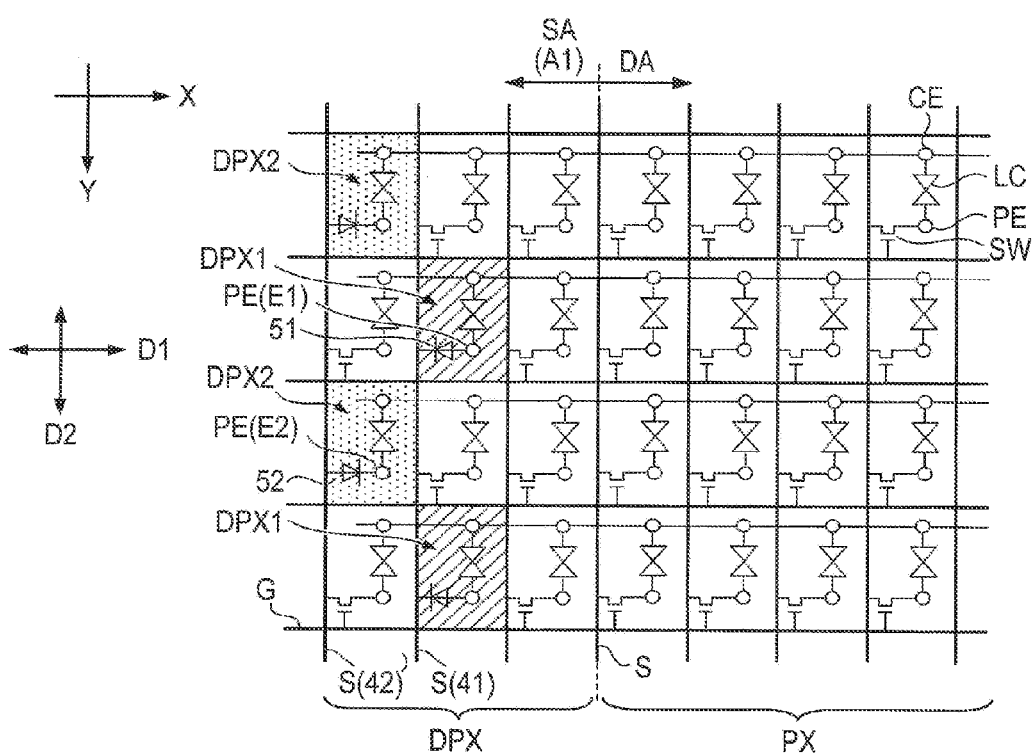
FIG. 15 is a diagram showing a seventh example.

FIG. 15 shows a seventh example. In the present example, the second video signal line S as counted from the left in the drawing is used as the first power supply line 41, and the leftmost video signal line S in the drawing is used as the second power supply line 42. The first rectifier 51 of the first dummy sub-pixel area DPX1 is connected to the first power supply line 41, and the second rectifier 52 of the second dummy sub-pixel area DPX2 is connected to the second power supply line 42.

The dummy sub-pixel areas DPX1 and DPX2 are alternately arranged in the first direction D1. Further, the dummy sub-pixel areas DPX1 and DPX2 are misaligned with each other in the second direction D2. Therefore, the electrodes E1 and E2 are alternately arranged in the second direction D2.

Eighth Example

Figure 16:
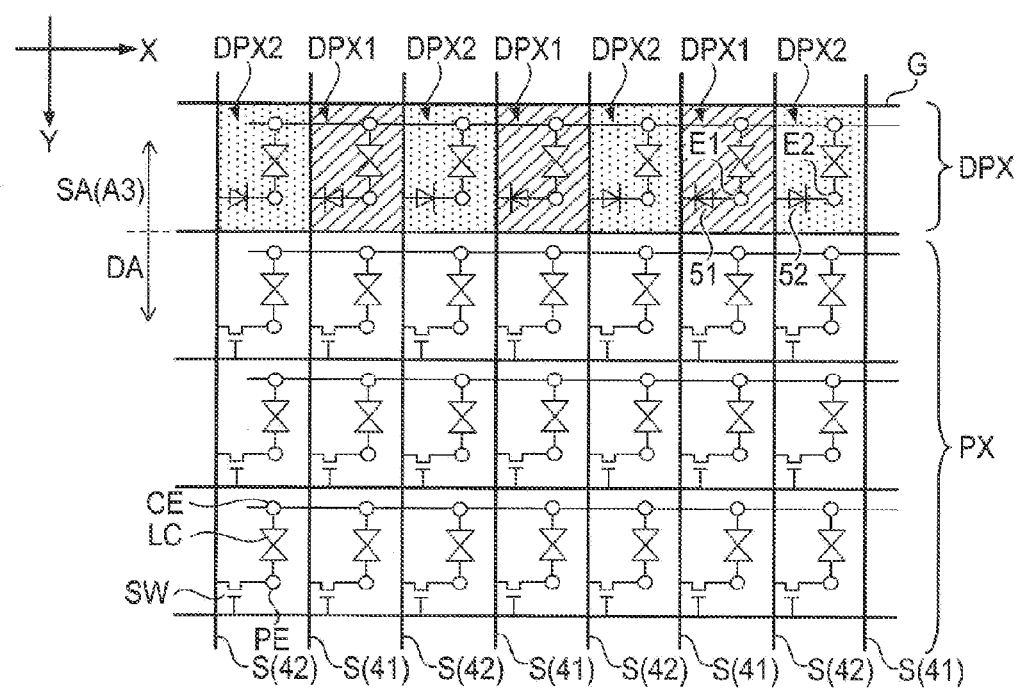
FIG. 16 is a diagram showing an eighth example.

FIG. 16 shows an eighth example. Here, the equivalent circuits of the sub-pixel area PX and the dummy sub-pixel area DPX in proximity to the boundary between the third area A3 and the display area DA are illustrated. In the present example, some of the video signal lines S function as the first power supply line 41, and the video signal lines S between these adjacent first power supply lines 41 function as the second power supply line 42.

In the surrounding area SA, the first rectifier 51 of the first dummy sub-pixel area DPX1 is connected to each of the first power supply lines 41, and the second rectifier 52 of the second dummy sub-pixel area DPX2 is connected to each of the second power supply lines 42. The dummy sub-pixel areas DPX1 and DPX2 are alternately arranged in the extension direction (X direction, second direction D2) of the scanning signal line G. Therefore, the electrodes E1 and E2 are alternately arranged in the extension direction of the scanning signal line G, accordingly.

In the example shown in FIG. 16, each of the dummy sub-pixel areas DPX1 and DPX2 is adjacent to the sub-pixel area PX without any intervening normal dummy sub-pixel area DPX. However, in the same manner as those of the sixth and seventh examples, normal dummy sub-pixel area(s) DPX may be interposed between each of the dummy sub-pixel areas DPX1 and DPX2 and the sub-pixel area PX.

Ninth Example

FIG. 17 shows a ninth example. The ninth example is different from the eighth example in that the dummy sub-pixel areas DPX1 and DPX2 are misaligned with each other in the extension direction (Y direction, first direction D1) of the video signal line S. These electrodes E1 and E2 are misaligned with each other in the extension direction of the video signal line S, accordingly.

Now, a structure applicable to each of the rectifiers 51 and 52 in the sixth to ninth examples will be described. FIG. 18 is a sectional diagram showing a structural example of a diode functioning as the second rectifier 52. The second rectifier 52 shown in the drawing includes a semiconductor layer 520. The semiconductor layer 520 is formed on the first insulating substrate 10 and is covered with the first insulating layer 11.

The semiconductor layer 520 includes a first impurity region 520 and a second impurity region 522 which surrounds the first impurity region 521. The first impurity region 521 is doped with p-type impurity ions. The second impurity region 522 is doped with n-type impurity ions. For example, boron (B) ions can be used as the p-type impurity ions. Further, for example, phosphorus (P) can be used as the n-type impurity ions.

The video signal line S is connected to the first impurity region 521 via a contact hole formed in the insulating layers 11 and 12. A relay electrode 530 is connected to the second impurity region 522 via a contact hole formed in the insulating layers 11 and 12. The pixel electrode PE of the second dummy sub-pixel area DPX2 is connected to the relay electrode 530 via a contact hole formed in the insulating layers 13 to 15.

In this structure, a positive-polarity voltage is supplied to the pixel electrode PE via the relay electrode 530 when the voltage of the video signal S has positive polarity, while no voltage is supplied to the pixel electrode PE when the voltage of the video signal S has negative polarity.

A structure similar to that of the second rectifier 52 shown in FIG. 18 is also applicable to a diode functioning as the first rectifier 51. In that case, the first impurity region 521 may be doped with n-type impurity ions, and the second impurity region 522 may be doped with p-type impurity ions. In this structure, a negative-polarity voltage is supplied to the pixel electrode PE via the relay electrode 530 when the voltage of the video signal S has negative polarity, while no voltage is supplied to the pixel electrode PE when the voltage of the video signal S has positive polarity.

Although the sixth and seventh examples are presented as the structure of the first area A1, structures similar to those of the sixth and seventh examples are also applicable to the second area A2. Further, the eighth and ninth examples are presented as the structure of the third area A3, but structures similar to those of the eighth and ninth examples are also applicable to the fourth area A4.

In the above-described present embodiment, the pixel electrode PE of the dummy sub-pixel area DPX is used as each of the electrodes E1 and E2. Therefore, these electrodes E1 and E2 will not be further provided in the surrounding area SA, and the size of the surrounding area SA can be reduced.

Further, in the present embodiment, the video signal line S is used as the voltage supply line 4 (each of the power supply lines 41 and 42). Therefore, voltage supply lines for the electrodes E1 and E2 will not be further provided, and the size of the surrounding area SA can be further reduced.

Still further, the same advantage as those of the above-described embodiments can be achieved from the present embodiment.

Note that, in the sixth to ninth examples, the dummy sub-pixel areas DPX1 and DPX2 are alternately arranged such that the cycle of one dummy sub-pixel area DPX1 and one dummy sub-pixel area DPX2 is repeated. However, this is in no way restrictive. For example, the dummy sub-pixel areas DPX1 and DPX2 may be alternately arranged such that the cycle of several first dummy sub-pixel areas DPX1 and several second dummy sub-pixel areas DPX2 is repeated. Further, normal dummy sub-pixel area(s) DPX may be interposed between these dummy sub-pixel areas DPX1 and DPX2.

Fourth Embodiment

The fourth embodiment will be described. In the following, the same structural elements as those of the above-described embodiments will be denoted by the same reference numbers, and detailed description thereof will be omitted.

Figure 19:
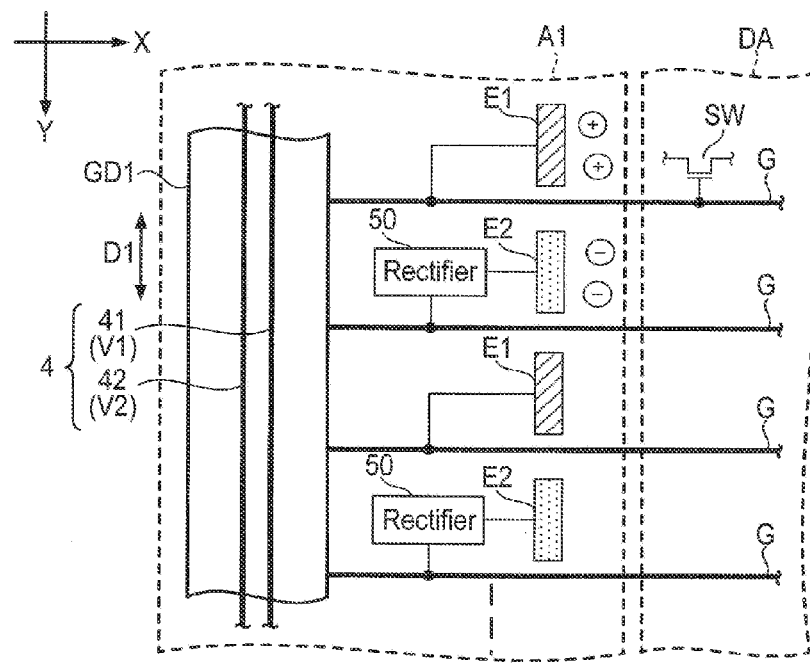
FIG. 19 is a diagram showing a structural example of a first area of a fourth embodiment.
Figure 20:
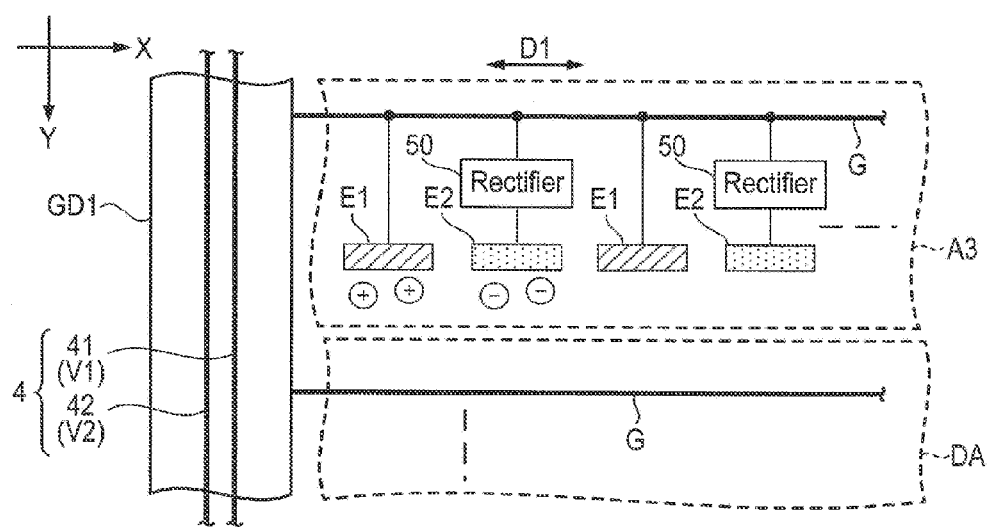
FIG. 20 is a diagram showing a structural example of a third area of the fourth embodiment.

In the present embodiment, each of the electrodes E1 and E2 is connected to the scanning signal line G. FIGS. 19 and 20 are explanatory diagrams schematically showing the fourth embodiment. FIG. 19 shows a structural example applicable to the first area A1, and FIG. 20 shows a structural example applicable to the third area A3.

As shown in FIG. 19, in the first area A1, the first electrode E1 is connected to one scanning signal line G, and the second electrode E2 is connected to the other scanning signal line G via a rectifier 50. These electrodes E1 and E2 are alternately arranged in the first direction D1. As described above, the first voltage V1 and the second voltage V2 are supplied respectively to the power supply lines 41 and 42 which constitute the voltage supply line 4. The first scan driver GD1 selectively supplies either the first voltage or the second voltage V2 to the scanning signal line G.

The voltage of the scanning signal line G is directly supplied to the first electrode E1. As described above, the first voltage V1 is off-voltage to turn off the switching element SW, and the second voltage V2 is on-voltage to turn on the switching element SW. In general, the length of time for which the first voltage V1 is supplied to the scanning signal line G is greater than the length of time for which the second voltage V2 is supplied to the scanning signal line G. Accordingly, the length of time for which the negative-polarity first voltage V1 is applied to the first electrode E1 is greater than the length of time for which the positive-polarity second voltage V2 is applied to the first electrode E1. Therefore, the first electrode E1 draws positive ions in the liquid crystal layer LC.

For example, a diode can be used as the rectifier 50. In this case, the anode of the rectifier 50 is connected to the scanning signal line G, and the cathode of the rectifier 50 is connected to the second electrode E2. In this way, between the voltages V1 and V2 which are supplied to the scanning signal line G, only the positive-polarity second voltage V2 is supplied to the second electrode E2. Note that, even although the second voltage V2 is supplied to the scanning signal line G for a short time, the second electrode E2 is continuously charged. An electric charge built up on the second electrode E2 draws negative ions in the liquid crystal layer LC.

As shown in FIG. 20, in the third area A3, the first electrode E1 is connected to the scanning signal line G, and the second electrode E2 is further connected to the same scanning signal line G via the rectifier 50. Note that these electrodes E1 and E2 may be connected to different scanning signal lines G from each other. Also in the structure shown in FIG. 20, the first electrode E1 draws positive ions, and the second electrode E2 draws negative ions.

Note that, although the structural example shown in FIG. 19 is presented as the structure of the first area A1, a structure similar to that shown in FIG. 19 is also applicable to the second area A2. Further, although the structural example shown in FIG. 20 is presented as the structure of the third area A3, a structure similar to that shown in FIG. 20 is also applicable to the fourth area A4.

Still further, as in the case with the third embodiment, the pixel electrode PE of the dummy sub-pixel area DPX can be used as each of the electrode E1 and E2. Now, certain examples of these structures will be described with reference to FIGS. 21 and 22.

Tenth Example

FIG. 21 shows a tenth example. Here, the equivalent circuits of the sub-pixel area PX and the dummy sub-pixel area DPX in proximity to the boundary between the first area A1 and the display area DA are illustrated. As in the case with the examples shown in FIGS. 14 to 17, the first area A1 includes the first dummy sub-pixel area DPX1 and the second dummy sub-pixel area DPX2.

In the first dummy sub-pixel area DPX1, the pixel electrode PE is directly connected to the scanning signal line G. This pixel electrode PE functions as the first electrode E1. In the second dummy sub-pixel area DPX2, the pixel electrode PE is connected to the scanning signal line G via the rectifier 50. This pixel electrode PE functions as the second electrode E2.

These dummy sub-pixel areas DPX1 and DPX2 are alternately arranged in the first direction D1 corresponding to the extension direction of the voltage supply line 4 shown in FIG. 19. Accordingly, the electrodes E1 and E2 are alternately arranged in the first direction D1. In the example shown in FIG. 21, normal dummy sub-pixel areas DPX are interposed between each of the dummy sub-pixel areas DPX1 and DPX2 and the sub-pixel area PX. However, each of the dummy sub-pixel areas DPX1 and DPX2 may be adjacent to the sub-pixel area PX without any intervening normal dummy sub-pixel area DPX.

Eleventh Example

Figure 22:
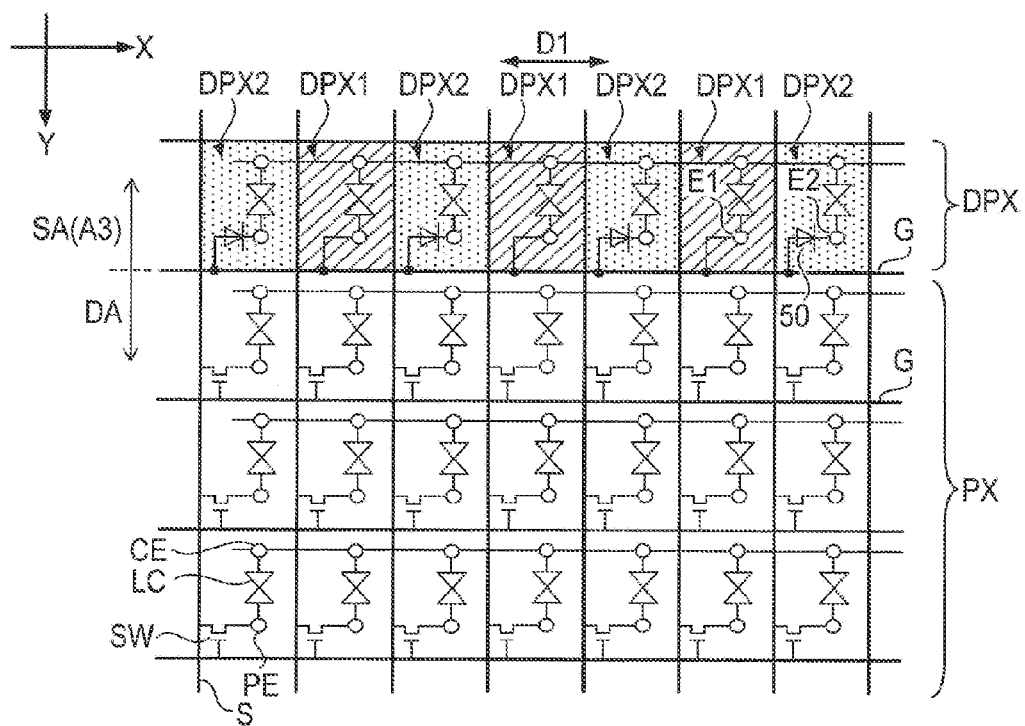
FIG. 22 is a diagram showing an eleventh example.

FIG. 22 shows an eleventh example. Here, the equivalent circuits of the sub-pixel area PX and the dummy sub-pixel area DPX in proximity to the boundary between the third area A3 and the display area DA are illustrated. In the present example, the dummy sub-pixel areas DPX1 and DPX2 are alternately arranged along one scanning signal line G. The pixel electrode PE of the first dummy sub-pixel area DPX1 is directly connected to the scanning signal line G. The pixel electrode PE of the second dummy sub-pixel area DPX2 is connected to the scanning signal line G via the rectifier 50.

In the example shown in FIG. 22, each of the dummy sub-pixel areas DPX1 and DPX2 is adjacent to the sub-pixel area PX without any intervening normal dummy sub-pixel area DPX. However, normal dummy sub-pixel area(s) DPX may be interposed between each of the dummy sub-pixel areas DPX1 and DPX2 and the sub-pixel area PX.

A structure similar to that of the tenth example is also applicable to the second area A2. Further, a structure similar to that of the eleventh example is also applicable to the fourth area A4.

Figure 23:
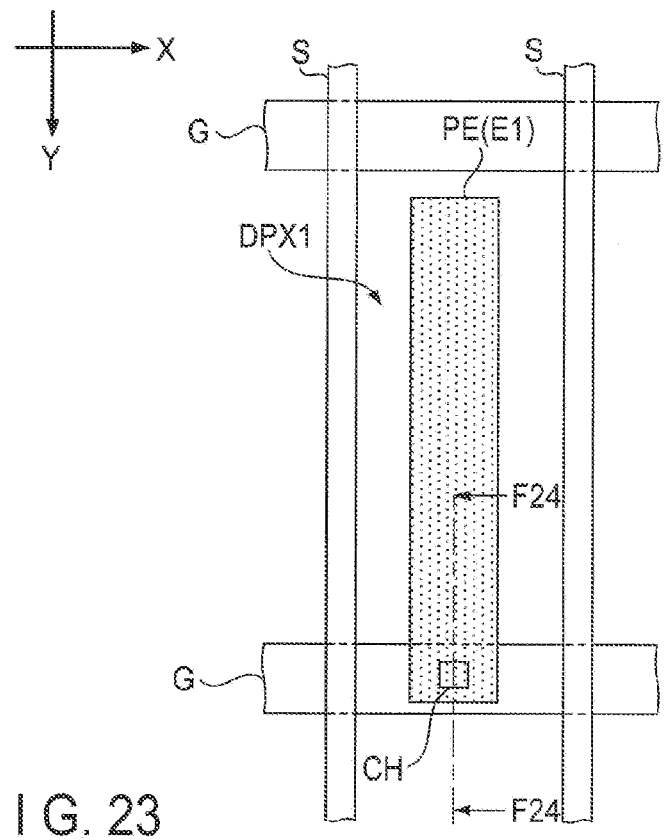
FIG. 23 is a plan view of a first dummy sub-pixel area.
Figure 24:
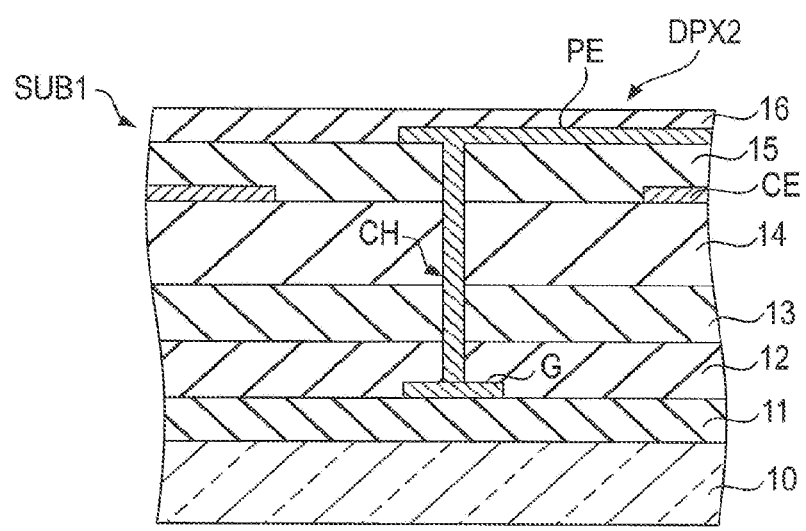
FIG. 24 is a sectional view of a first substrate taken along line F24-F24 of FIG. 23.

Now, a structural example of the first dummy sub-pixel area DPX1 will be described. FIG. 23 is a plan view of the first dummy sub-pixel area DPX1. FIG. 24 is a sectional view of the first substrate SUB1 taken along line F24-F24 of FIG. 23.

As shown in FIGS. 23 and 24, the pixel electrode PE of the first dummy sub-pixel area DPX1 extends to such an extent that the pixel electrode PE of the first dummy sub-pixel area DPX1 overlaps the scanning signal line G to which the first dummy sub-pixel area DPX1 is to be connected. Further, the first dummy sub-pixel area DPX1 is connected to this scanning signal line G via a contact hole CH formed in the insulating layers 12 to 15.

In this way, since the pixel electrode PE is directly connected to the scanning signal line G, the structure of the first dummy sub-pixel area DPX1 is simplified. It is also possible to form a relay electrode on the second insulating layer 12 or the like and connect the pixel electrode PE to the scanning signal line G via the relay electrode.

In the tenth and eleventh examples, the diode structure shown in FIG. 18 is applicable to the rectifier 50. As an alternative to a diode, a bridge circuit or the like can be used as the rectifier 50.

In the above-described present embodiment, as in the case with the third embodiment, the pixel electrode PE of the dummy sub-pixel area DPX is used as each of the electrodes E1 and E2. Therefore, these electrodes E1 and E2 will not be further provided in the surrounding area SA, and the size of the surrounding area SA can be reduced.

Further, the same advantage as those of the above-described embodiments can be achieved from the present embodiment.

Note that, in the tenth and eleventh examples, the dummy sub-pixel areas DPX1 and DPX2 are alternately arranged such that the cycle of one dummy sub-pixel area DPX1 and one dummy sub-pixel area DPX2 is repeated. However, this is in no way restrictive. For example, the dummy sub-pixel areas DPX1 and DPX2 may be alternately arranged such that the cycle of several first dummy sub-pixel areas DPX1 and several second dummy sub-pixel areas DPX2 is repeated. Further, normal dummy sub-pixel area(s) DPX may be interposed between these dummy sub-pixel areas DPX1 and DPX2.

In each of the areas A1 to A4, the number of the first dummy sub-pixel areas DPX1 and the number of the second dummy sub-pixel areas DPX2 may be different from each other. For example, since the time for supplying the second voltage V2 is less than the time for supplying the first voltage V1, in each of the areas A1 to A4, the number of the second dummy sub-pixel areas DPX2 may be set to be greater than the number of the first dummy sub-pixel areas DPX1. In that case, m>n may be satisfied, where n is the number of the successively-arranged first dummy sub-pixel areas DPX1 and m is the number of the successively-arranged second dummy sub-pixel areas DPX2 in each of the areas A1 to A4.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The structures described in the respective embodiments may be appropriately combined with each other. For example, structural examples of different embodiments may be appropriately selected as the structures of the areas A1 to A4.

In each of the embodiments, the first voltage V1 is supplied to the first power supply line 41, and the second voltage V2 is supplied to the second power supply line 42. However, the voltage to be supplied to each of the power supply lines 41 and 42 may be appropriate modified. An example of the modification will be described with reference to FIG. 25.

Figure 25:
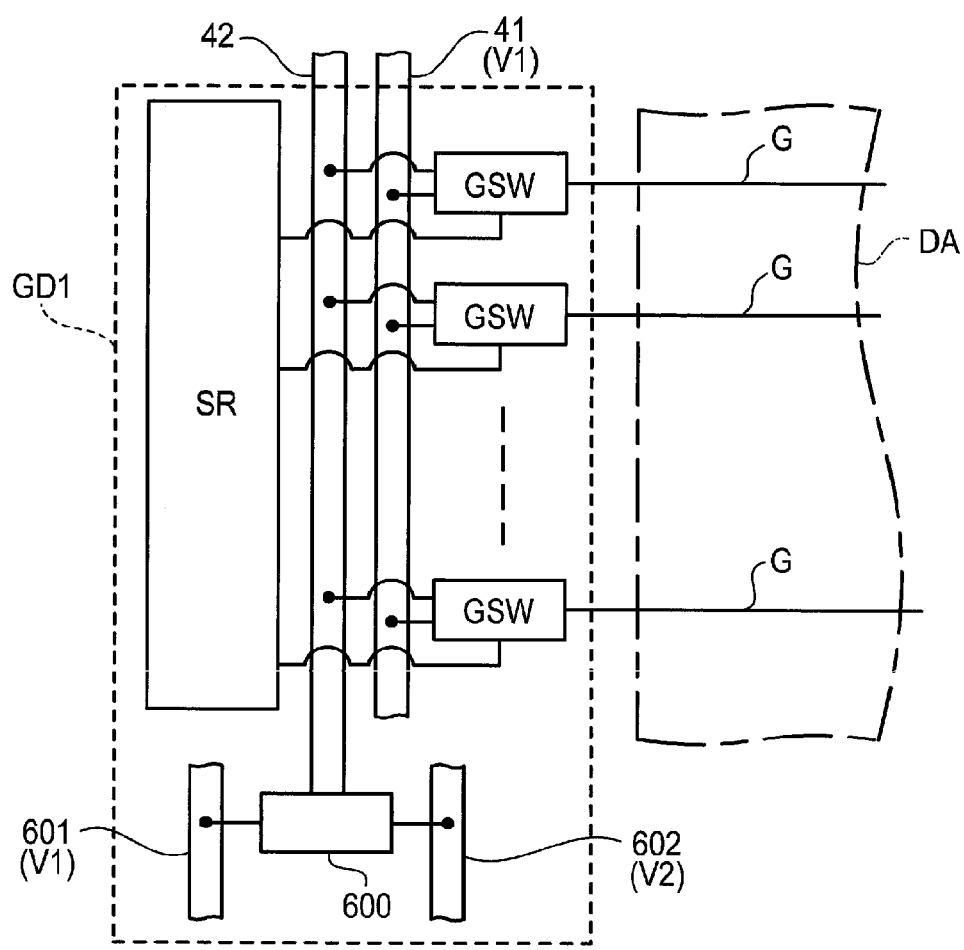
FIG. 25 is a diagram showing a modification of a first scan driver.

FIG. 25 is a schematic plan view of the first scan driver GD1. The structure of the first scan driver GD1 is different from that shown in FIG. 2 in that the first scan driver GD1 further includes a voltage switching circuit 600. The voltage switching circuit 600 is connected to the second power supply line 42, a low voltage line 601 and a high voltage line 602.

The first voltage V1 is supplied to the low voltage line 601, and the second voltage V2 is supplied to the high voltage line 602. For example, as in the case with the above-described embodiments, the first voltage V1 is the voltage VGL, and the second voltage V2 is the voltage VGH. The voltage switching circuit 600 alternately switches the voltage to be supplied to the second power supply line 42 between these voltages V1 and V2. The first voltage V1 is continuously supplied to the first power supply line 41.

The shift resister circuit SR sequentially outputs the shift pulse to each of the gate switch circuits GSW. When the shift pulse is not input to the gate switch circuit GSW, the gate switch circuit GSW outputs the first voltage V1, which is supplied to the first power supply line 41, to the corresponding scanning signal line G. Also, when the shift pulse is input to the gate switch circuit GSW and the first voltage V1 is supplied to the second power supply line 42, the gate switch circuit GSW outputs the first voltage V1 to the corresponding scanning signal line G. On the other hand, when the shift pulse is input to the gate switch circuit GSW and the second voltage V2 is supplied to the second power supply line 42, the gate switch circuit GSW supplies the second voltage V2 to the corresponding scanning signal line G.

When the above-described display device is in a standby mode of displaying a black screen, the first voltage V1 is supplied from the first power supply line 41. Further, in a mode of displaying a color image, the second power supply line 42 is selected by the shift resister circuit SR, and the first voltage V1 and the second voltage V2 are alternately supplied to the scanning signal line G under the switching control of the voltage switching circuit 600.

The above-described structure is also applicable to the second scan driver GD2.

In the case of applying the modification shown in FIG. 25 to the first and second embodiments, the first voltage V1 and the second voltage V2 are alternately applied to the second electrode E2 which is connected to the second power supply line 42. In that case, a rectifier may be interposed between the second electrode E2 and the second power supply line 42. When the rectifier is provided, the first voltage V1, which is supplied to the second power line 42, will not be applied to the second electrode E1, and the second voltage V2, which is supplied to the second power line 42, will be applied to the second electrode E2. As the rectifier, the above-described diode can be used.

What is claimed is:

1. A display device comprising:
a first substrate;
a second substrate opposed to the first substrate;
a liquid crystal layer between the first substrate and the second substrate;
a display area;
a peripheral area outside the display area;
a light-shielding layer overlapping the peripheral area;
a voltage supply line provided in the peripheral area and extending in a first direction;
first electrodes and a second electrode provided in the peripheral area and connected to the voltage supply line;
scanning signal lines; and
a scan driver provided in the peripheral area and connected to the voltage supply line, wherein
the first electrodes and the second electrode are arranged in either the first direction or a second direction crossing the first direction, and
the second electrode is located between the first electrodes,
a first voltage supplied to the first electrodes is different from a second voltage supplied to the second electrode,
the voltage supply line includes a first power supply line to which the first voltage is supplied, and a second power supply line to which the second voltage is supplied,
the scan driver selectively supplies either the first voltage or the second voltage to the scanning signal lines, and
the first electrodes are connected to the first power supply line, and the second electrode is connected to the second power supply line.

2. The display device of claim 1, further comprising:
video signal lines crossing the scanning signal lines; and
sub-pixel areas defined by the scanning signal lines and the video signal lines.

3. The display device of claim 2, wherein
the sub-pixel areas include a first sub-pixel area, a second sub-pixel area, and a third sub-pixel area,
the peripheral area includes the first sub-pixel area and the second sub-pixel area, and the display area includes the third sub-pixel area,
the first sub-pixel area and the second sub-pixel area are arranged in the first direction,
the first sub-pixel area includes the first electrodes, the second sub-pixel area includes the second electrode, and the third sub-pixel area includes a pixel electrode,
the pixel electrode is electrically connected to the video signal line, and
the first electrodes and the second electrode are electrically connected to the scanning signal lines.

4. The display device of claim 1, wherein the first electrodes and the second electrode are closer to the liquid crystal layer than the voltage supply line.

5. The display device of claim 1, wherein
the first power supply line is located between the second power supply line and the display area in planar view, and
the first electrodes and the second electrode are located between the first power supply line and the display area in planar view.

6. The display device of claim 1, therein
the first electrodes and the second electrode are located between the first power supply line and the second power supply line in planar view.

7. The display device of claim 1, further comprising a third electrode to which a third voltage intermediate between the first voltage and the second voltage is applied, wherein
the third electrode is arranged between one of the first electrodes and the second electrode.

8. The display device of claim 1, wherein
the peripheral area includes a first area, a second area, a third area, and a fourth area,
the first area and the second area face each other across the display area,
the third area and the fourth area are arranged in a direction different from a direction in which the first area and the second area are arranged, and face each other across the display area,
the first area includes a scan driver which supplies a scanning signal to a scanning signal line,
shapes of one of the first electrodes and the second electrode in either the first area or the second area are different from shapes of one of the first electrodes and the second electrode in either the third area or the fourth area.

9. The display device of claim 8, wherein
a width of an electrode array of the first electrode and the second electrode in either the first area or the second area is a first width,
a width of an electrode array of the first electrode and the second electrode in either the third area or the fourth area is a second width, and
the first width and the second width are different from each other.

10. A display device comprising:
a first substrate;
a second substrate opposed to the first substrate;
a liquid crystal layer between the first substrate and the second substrate;
a display area;
a peripheral area outside the display area;
a light-shielding layer overlapping the peripheral area;

a voltage supply line provided in the peripheral area and extending in a first direction;
a first electrode and a second electrode provided in the peripheral area and connected to the voltage supply line;
scanning signal lines; and
a scan driver provided in the peripheral area and connected to the voltage supply line, wherein
the first electrode and the second electrode are closer to the liquid crystal layer than the voltage supply line,
the first electrode and the second electrode are arranged in either the first direction or a second direction crossing the first direction,
a first voltage supplied to the first electrode is different from a second voltage supplied to the second electrode,
the voltage supply line includes a first power supply line to which the first voltage is supplied, and a second power supply line to which the second voltage is supplied,
the scan driver selectively supplies either the first voltage or the second voltage to the scanning signal lines, and
the first electrode is connected to the first power supply line, and the second electrode is connected to the second power supply line.

11. The display device of claim 10, further comprising:
video signal lines crossing the scanning signal lines; and
sub-pixel areas defined by the scanning signal lines and the video signal lines.

12. The display device of claim 11, wherein
the sub-pixel areas include a first sub-pixel area, a second sub-pixel area, and a third sub-pixel area,
the peripheral area includes the first sub-pixel area and the second sub-pixel area, and the display area includes the third sub-pixel area,
the first sub-pixel area and the second sub-pixel area are arranged in the first direction,
the first sub-pixel area includes the first electrode, the second sub-pixel area includes the second electrode, and the third sub-pixel area includes a pixel electrode,
the pixel electrode is electrically connected to the video signal line, and
the first electrode and the second electrode are electrically connected to the scanning signal lines.

13. The display device of claim 10, wherein
the first power supply line is located between the second power supply line and the display area in planar view, and
the first electrode and the second electrode are located between the first power supply line and the display area in planar view.

14. The display device of claim 10, wherein
the first electrode and the second electrode are located between the first power supply line and the second power supply line in planar view.

15. The display device of claim 11, wherein
the voltage supply line is the video signal line, and
the first electrode and the second electrode are provided within the sub-pixel areas.

16. A display device comprising:
a first substrate;
a second substrate opposed to the first substrate;
a liquid crystal layer between the first substrate and the second substrate;
a display area;
a peripheral area outside the display area;
a light-shielding layer overlapping the peripheral area;
a voltage supply line provided in the peripheral area and extending in a first direction; and
a first electrode and a second electrode provided in the peripheral area and connected to the voltage supply line, wherein
the first electrode and the second electrode are closer to the liquid crystal layer than the voltage supply line,
the first electrode and the second electrode are arranged in either the first direction or a second direction crossing the first direction,
a first voltage supplied to the first electrode is different from a second voltage supplied to the second electrode,
the voltage supply line includes a first power supply line to which the first voltage is supplied, and a second power supply line to which the second voltage is supplied,
the first electrode is connected to the first power supply line, and the second electrode is connected to the second power supply line, and
the display device satisfies following elements (1) or (2),
(1) the first power supply line is located between the second power supply line and the display area in planar view, and the first electrode and the second electrode are located between the first power supply line and the display area in planar view,
(2) the first electrode and the second electrode are located between the first power supply line and the second power supply line in planar view.

17. The display device of claim 16, further comprising:
scanning signal lines;
video signal lines crossing the scanning signal lines; and
sub-pixel areas defined by the scanning signal lines and the video signal lines.

18. The display device of claim 17, wherein
the sub-pixel areas include a first sub-pixel area, a second sub-pixel area, and a third sub-pixel area,
the peripheral area includes the first sub-pixel area and the second sub-pixel area, and the display area includes the third sub-pixel area,
the first sub-pixel area and the second sub-pixel area are arranged in the first direction,
the first sub-pixel area includes the first electrode, the second sub-pixel area includes the second electrode, and the third sub-pixel area includes a pixel electrode,
the pixel electrode is electrically connected to the video signal line, and
the first electrode and the second electrode are electrically connected to the scanning signal lines.

* * * * *